(12) United States Patent
Sorori et al.

(10) Patent No.: US 6,423,471 B1
(45) Date of Patent: Jul. 23, 2002

(54) PHOTOSENSITIVE COMPOSITION AND METHOD OF MAKING LITHOGRAPHIC PRINTING PLATE

(75) Inventors: Tadahiro Sorori; Yasufumi Murota, both of Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/620,990

(22) Filed: Jul. 20, 2000

(30) Foreign Application Priority Data

Jul. 23, 1999 (JP) .......................... 11-209822

(51) Int. Cl.$^7$ ............................. B03F 7/027
(52) U.S. Cl. .................... 430/281.1; 430/302
(58) Field of Search ............... 430/281.1, 302; 522/29

(56) References Cited

U.S. PATENT DOCUMENTS

| | | | |
|---|---|---|---|
| 5,776,996 A | | 7/1998 | Okamoto et al. ............ 522/26 |
| 5,800,965 A | * | 9/1998 | Tsuji et al. .............. 430/287.1 |
| 5,863,678 A | * | 1/1999 | Urano et al. ................ 430/7 |
| 6,153,660 A | * | 11/2000 | Fujimaki et al. ............ 522/29 |

FOREIGN PATENT DOCUMENTS

| | | |
|---|---|---|
| EP | 0 723 167 A2 | 7/1996 |
| EP | 0 924 570 A1 | 6/1999 |
| JP | 10186654 A | 4/1998 |

OTHER PUBLICATIONS

Pigment Handbook, Lewis, P.A. ed. vol. 2, John Wiley & Sons, NY, 1988, 429–559.*

* cited by examiner

*Primary Examiner*—Rosemary Ashton
(74) *Attorney, Agent, or Firm*—Burns, Doane, Swecker & Mathis, LLP

(57) ABSTRACT

A photosensitive composition comprising (i) at least one titanocene compound (ii) an addition polymerizable compound containing at least one ethylenically unsaturated double bond and (iii) at least one pigment having an optical characteristic such that the transmittance at 500 nm is relatively smaller than the transmittance at 400 nm. Also disclosed is a method of producing a lithographic printing plate using a lithographic printing plate precursor comprising the photosensitive composition.

20 Claims, No Drawings

PHOTOSENSITIVE COMPOSITION AND METHOD OF MAKING LITHOGRAPHIC PRINTING PLATE

FIELD OF THE INVENTION

The present invention relates to a photosensitive composition having excellent stability and handling characteristics as well as high sensitivity, and to an image formation method using such a composition. In particular, the invention relates to a photosensitive composition and an image formation method suitably applicable to a lithographic printing plate precursor material which enables platemaking with scanning exposure based on digital signals.

BACKGROUND OF THE INVENTION

Hitherto the presensitized plate (abbreviated as "PS plate" hereinafter) comprising a hydrophilic support and an ink-receptive photopolymer layer provided thereon has been widely used as a lithographic printing plate. In a conventional method for making such a printing plate, mask exposure (area exposure) is generally carried out via a lith film, and then the non-imaging area is dissolved and removed with a developer.

In recent years has been widely spread the technology to digitize image information by electronically processing, storing and outputting the image information by the use of a computer. And a variety of new image-output systems which can keep up with such digitization technology have become practical. Under these circumstances, it has been anxiously awaited to develop the computer-to-plate (CTP) technology which enables the direct platemaking to be performed by scanning highly directional light, such as laser beams, corresponding to the digitized image information, but not using a lith film. And the development of printing plate precursors suitable for such technology has been an important technical problem.

As a method of enabling the utilization of scanning exposure in case of making a lithographic printing plate, the structure that a photopolymerizable composition having a high photosensitization speed (hereinafter also referred to as a photosensitive composition) is incorporated in an ink-receptive photopolymer layer (hereinafter also referred to as a photosensitive layer) provided on a hydrophilic support was proposed, and the lithographic plate precursors having such a structure have already been on the market. Those plate precursors are simple in development processing, and provide desirable plate-making and printing performances, including high resolution, excellent inking properties, a long press life and high scum resistance.

The photosensitive composition having ink receptivity is basically constituted of an ethylenically unsaturated compound and a photopolymirization initiator. Further, a binder resin can be contained therein, if needed. Such a composition forms images by a mechanism that the photopolymerization initiator absorbs light to produce active radicals, and these radicals set off the addition polymerization of the ethylenically unsaturated compound to render the photosensitive layer insoluble.

As to the light source which is used at the time when the lithographic printing plate precursor of photopolymerization type is exposed for platemaking, visible light sources of long wavelengths, such as Ar laser (488 nm) and FD-YAG laser (532 nm), have been employed, but there has been a desire to increase the productivity by writing at a higher speed. In the photopolymer-CTP system of conventional type, however, the writing at a higher speed is not yet realized because the output of light sources usable therefor is not sufficiently high and the usable plate precursors also don't have sufficiently high sensitivity. Further, the conventional systems are disadvantageous in that, as they are designed so as to respond to Ar laser (488 nm) or FD-YAG laser (532 nm), the photosensitive materials used therefor is required to have high sensitivity in the vicinity of 500 nm. As a result, it is necessary to carry out all the operations, including those for taking out a plate from a cardboard package, loading a plate setter in a cassette and inserting a plate in a plate setter, under a red safelight, so that the workability is considerably low. Therefore, it has been desired to make it possible to handle plates under daylight.

In recent years, on the other hand, semiconductor laser devices possible to continuously oscillate in the wavelength region of 350 to 450 nm, wherein InGaN or ZnSe materials are used, have been in a practical-use stage. The scanning exposure system using such a light source of short wavelengths carries an advantage that it can have satisfactory output, and besides, can be constructed economically because the production of semiconductor laser devices is inexpensive from the structural point of view. Further, such exposure systems make it possible to use the photosensitive materials having their sensitivities in short wavelength region to enable operations to be performed under a bright safelight, compared with conventional systems using FD-YAG or Ar laser devices.

However, there have not yet been known any photopolymerization initiators having sensitivity high enough for scanning exposure in the short wavelength region of 350 nm to 450 nm.

Furthermore, the techniques to obtain a photosensitive composition suitable for laser scanning and having high productivity and excellent handling properties under daylight have been extensively longed for in the imaging field. And it is expected to apply such techniques to the image formation by, e.g., photo-molding, holography or color hard copy, and to the field for the production of electronic materials, such as photoresist.

SUMMARY OF THE INVENTION

Therefore, a main object of the invention is to construct a CTP system that can achieve excellent productivity, operation suitability and economical efficiency. More specifically, what the invention is mainly aiming at is providing a photosensitive composition having high sensitivity at the oscillation wavelengths of inexpensive short-wavelength semiconductor laser devices and capable of being handled also under bright safelight, and a method for image formation using the composition.

Other objects and effects of the present invention will become apparent from the following description.

As a result of extensive studies made by the present inventors to achieve the aforementioned objects, it has been found that the sensitivity high enough to enable high-speed scanning exposure and the suitability for operations under bright safelight can be both attained with a photosensitive composition comprising (i) at least one titanocene compound, (ii) an addition polymerizable compound containing at least one ethylenically unsaturated double bond and (iii) at least one pigment having an optical characteristic such that the transmittance at 500 nm is relatively smaller than the transmittance at 400 nm. Thus, the present invention is based on this finding.

DETAILED DESCRIPTION OF THE INVENTION

A first problem for completion of the invention consists in acquisition of sensitivity high enough to enable high-speed scanning exposure in the wavelength region of 350 nm to 450 nm. For solution of such a problem, it is necessary to search for an appropriate photo-initiation system. We have now found that the sensitivity sufficient in a practical sense can be achieved when a titanocene compound is employed and, if necessary, in combination with a sensitizing dye. The usefulness of a titanocene compound-containing photo-initiation system as a photopolymerizable composition suitable for scanning exposure is disclosed, e.g., in JP-B-4-47680 (the term "JP-B" as used herein means an "examined Japanese patent publication"). In addition, the photo-initiation system comprising the combinations of carbomerocyanine dyes with titanocene are disclosed in JP-A-9-328505, JP-A-8-272096 and JP-A-8-262715 (the term "JP-A" as used herein means an "unexamined published Japanese patent application"), the photopolymerizing composition comprising a photoreducing dye and a titanocene in combination with a specified polymerizing monomer is disclosed in JP-A-4-221958, the photo-initiation systems comprising the combinations of titanocene with particular aminobenzilideneketone dyes are disclosed in JP-A-4-194857, JP-A-6-295061, JP-A-7-84863, JP-A-220755, JP-A-9-80750 and JP-A-9-236913, the photo-initiation systems comprising the combinations of titanocene with particular coumarin dyes are disclosed in JP-A-4-184344, JP-A-7-43896, WO 95/09383, JP-A-6-301208, JP-A-7-271284, JP-A-8-29973 and JP-A-9-80751, and the photo-initiation systems comprising the combinations of titanocene with pyromethine dyes are disclosed in JP-A-7-225474, JP-A-7-5685, JP-A-7-281434 and JP-A-8-6245. However, all of the patents cited above disclose that those systems are highly sensitive to visible light of long wavelengths around 500 nm, but they have no suggestion on the possibility of scanning exposure in the short-wavelength region of 350 nm to 450 nm. The present inventors found that the titanocene-containing photo-initiator system can show sensitivity sufficient to enable scanning exposure even in the short-wavelength region. In addition, we found that such a system can have higher sensitivity when used in combination with a sensitizing dye exhibiting high absorption in a short wavelength region.

However, it was found out that the photosensitive composition using such a photo-initiator system was insufficient in handling suitability under a bright light. A cause of this insufficiency was supposed to lie in that titanocene itself has a light absorption band extended to around 500 nm, though the intensity thereof is very weak. In a case of applying such a photosensitive composition to the photosensitive layer of a lithographic printing plate precursor, it was feasible, although insufficient, to control sensitivities in the long wavelength region (450 nm or longer) while maintaining the sensitivities in the short wavelength region (from 350 nm to 450 nm) by devising constituents for the photosensitive layer so as to reduce as greatly as possible the amount of a titanocene compound added. In other words, even when the operation was performed under a darkroom safelight, or a yellow light free of an emission band 500 nm or shorter, the fog characteristic of the plate precursor was still below the practically satisfactory level. Such being the case, although we were under the pressure of necessity to solve the second problem of controlling the fog generation caused by light of long wavelengths without sacrificing the sensitivities to light of short wavelengths, we have now resolved this problem by addition of a particular pigment. More specifically, a satisfactory solution to this problem has been brought about by the use of at least one pigment having an optical characteristic that the transmittance at 500 nm is relatively lower than the transmittance at 400 nm. The pigment usable in the invention is required to be dispersed into a photosensitive composition in a state that, viewed microscopically, the pigment and other components are mixed inhomogeneously. In general the pigment is dispersed in the form of fine grains having an average grain size smaller than about 5 $\mu$m. In cases of using other coloring agents, e.g., dyes which are soluble in organic solvents to form a molecular dispersion in a photosensitive composition and homogeneously compatible with other components on the molecular level, the fog generation at long wavelengths was rather aggravated, or the sensitivities at short wavelengths were considerably lowered. Additionally, the use of pigments which do not have the optical characteristic that the transmittance at 500 nm is relatively lower than that at 400 nm lowers considerably the sensitivities at short wavelengths.

The photosensitive composition according to the invention is described below in detail.

Pigment

In the first place, the pigment usable as Component (iii) of the present photosensitive composition is illustrated below. This component is most important to the present photosensitive composition and required to have an optical characteristic such that the transmittance at 500 nm is relatively lower than the transmittance at 400 nm.

The pigments used as Component (iii) in the invention have no particular restrictions so far as they have an optical characteristic that the transmittance at 500 nm is relatively lower than the transmittance at 400 nm. The optical characteristics of pigments can be controlled by properly selecting the chemical structures and the dispersed conditions (including the grain size and the state of dilution) of coloring materials as constituents of the pigments. The optical characteristics of pigments can be examined with ease, e.g., by forming a pigment-dispersed film on an optically transparent support and measuring the transmittance of the film with a general-purpose spectrophotometer. In another case where an opaque support is used for forming a pigment-dispersed film, the transmittance of the pigment can be determined as the reciprocal of the reflectance measured by the method of regular reflection measurement or diffuse reflection measurement.

Suitable examples of a pigment used in the invention are illustrated below in terms of C.I. Number described in *Colour Index*, Third Edition, published by The Society of Dyes and Colourists.

Azo Pigments
  For example, Pigment Orange 13, 16, 2, 24, 31,
  Pigment Red 1, 22, 3, 38, 4, 48, 49, 60, 63, 9, 166, 144, and
  Pigment Brown 23.
Pelyrene Pigments
  For example, Pigment Orange 7,
  Pigment Red 123, 178, 179, 224, 149, 190, and
  Pigment Violet 29.
Pyrazoloquinazolone Pigments
  For examples, Pigment Red 251, 252, and
  Pigment Orange 67.
Aminoanthraquinone Pigments
  For example, Pigment Red 177.
Quinacridone Pigments
  For example, Pigment Violet 19, and
  Pigment Red 122, 202.
Acid Dye Lake Pigments
  For example, Pigment Blue 61, 56, 57.
Basic Dye Lake Pigments
  For example, Pigment Violet 1, and
  Pigment Red 81.
Other Pigments
  For example, French Ultramarine.

In a case where the coloring compounds as constituents of pigments assume a state of molecular dispersion (solution), but not in a state of solid dispersion, when incorporated in the photosensitive layer of a lithographic printing plate precursor, they cause an adverse effect, such as an increase in fog or desensitization. In the invention, therefore, it is desirable to employ the pigments of the kind which cause such an adverse effect to the least possible extent. Viewing the pigment in the light of its absorption spectrum characteristics and solubility depending on the chemical structures of pigment constituents, the pigments suitable for the invention include azo pigments, perylene pigments, pyrazoloquinazolone pigments, aminoanthraquinone pigments, quinacridone pigments, acidic dye lake pigments and basic dye lake pigments. Of these pigments, azo pigments, acidic dye lake pigments, pyrazoloquinazolone pigments and quinacridone pigments are preferred over the other pigments.

The chemical structural formulae of coloring materials which can constitute pigments suitable for the invention are shown below:

-continued
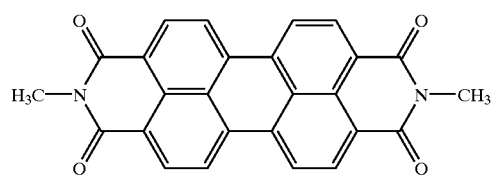
(P-7)
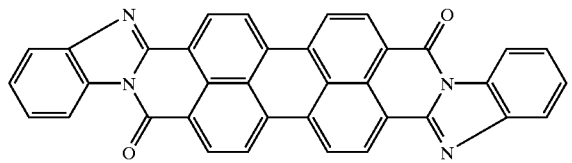
(P-8)
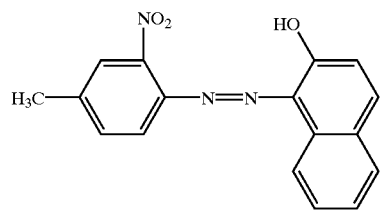
(P-9)
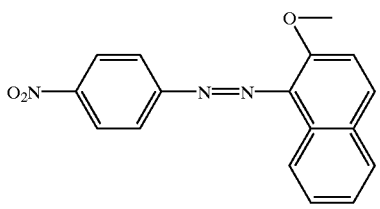
(P-10)
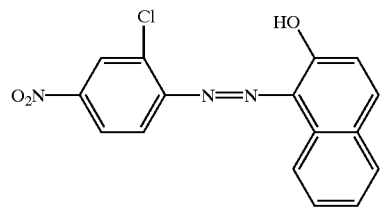
(P-11)
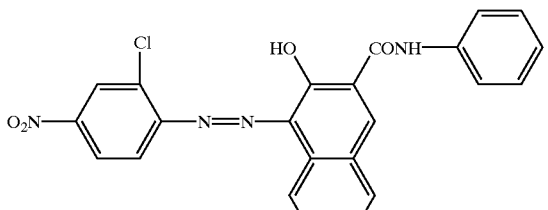
(P-12)
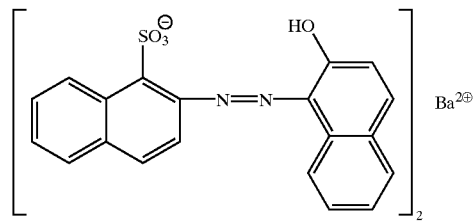
(P-13)
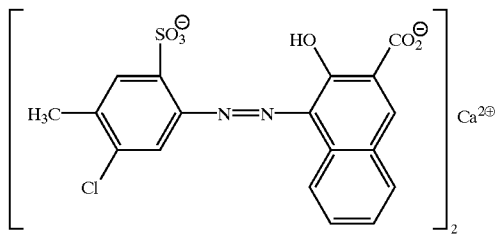
(P-14)
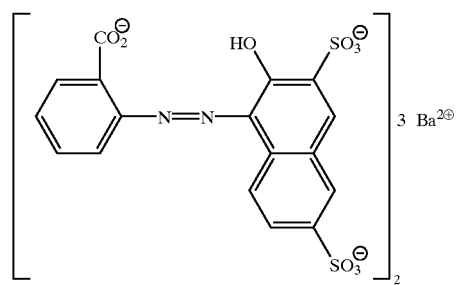
(P-15)
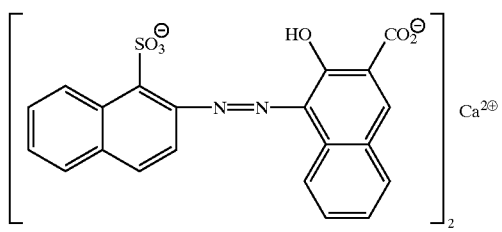
(P-16)
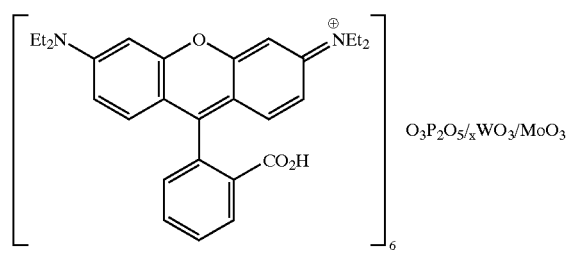
(P-17)
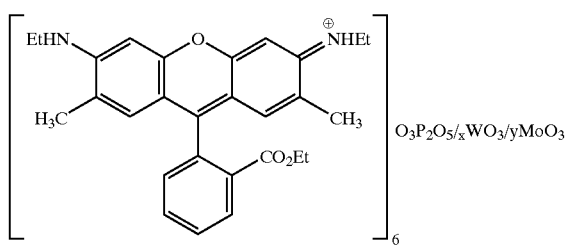
(P-18)

-continued
(P-19)
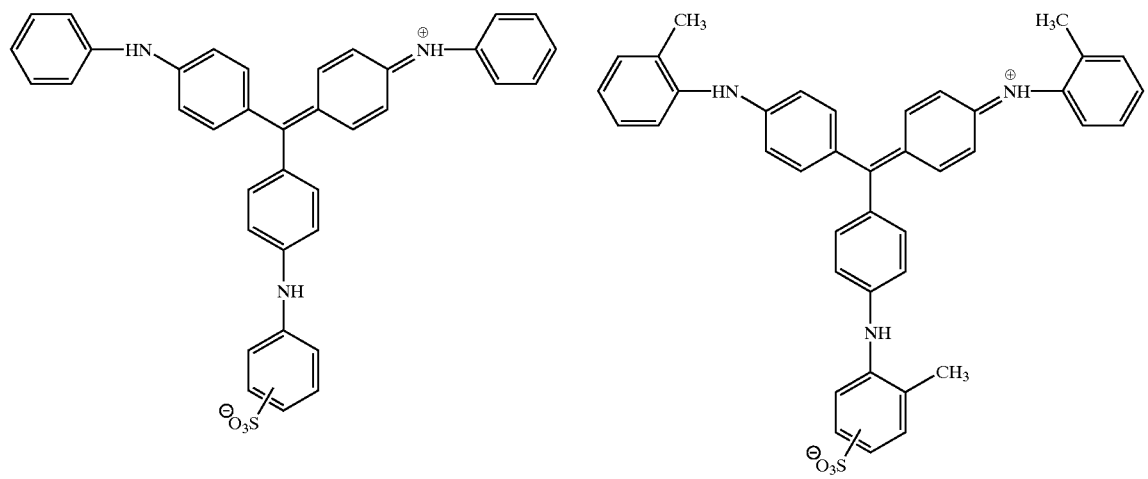
(P-20)
(P-21)
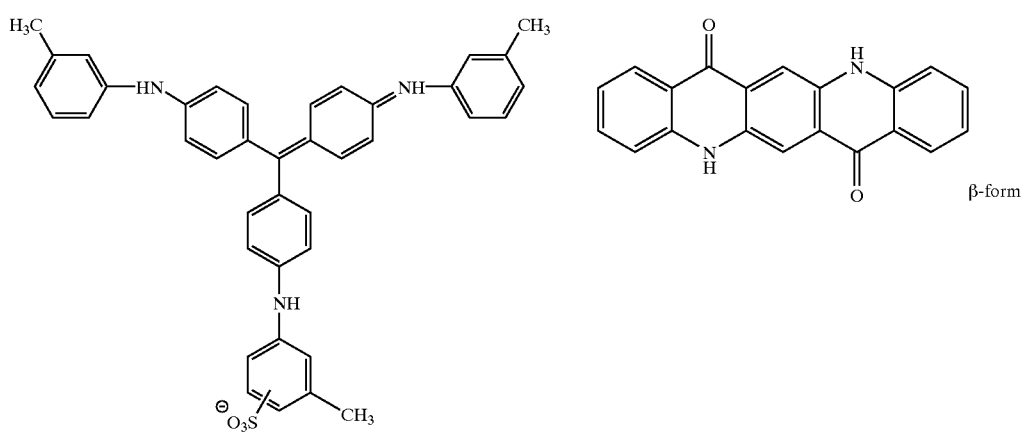
(P-22) β-form
(P-23)
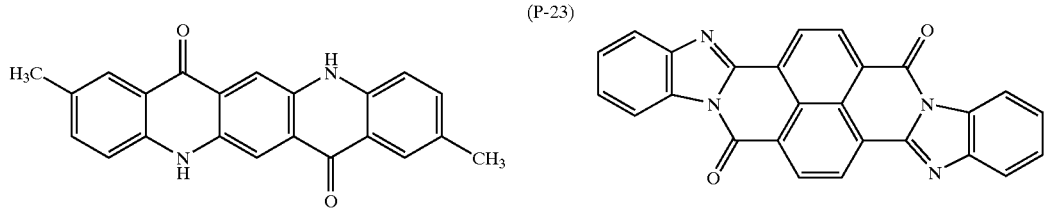
(P-24)
(P-25)
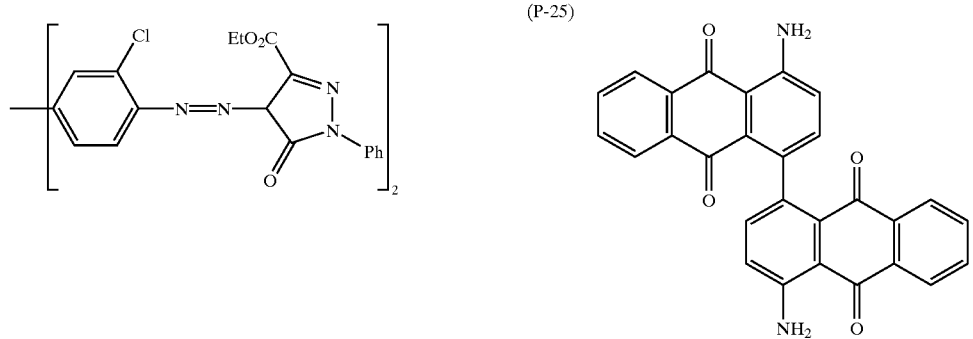
(P-26)

(P-27)

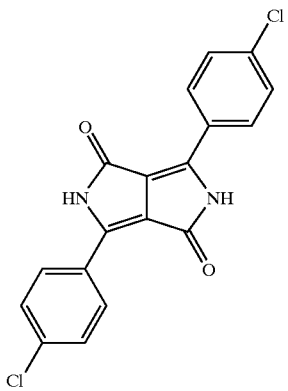

In the second place, the general dispersion method for pigments is described below. However, the following description should not be construed as limiting the scope of the invention in any way.

The pigments after syntheses are generally dried in a variety of ways, and then supplied. Inmost cases, the pigments are separated from an aqueous medium, dried and then supplied in the form of powder. The drying of water requires a great latent heat of evaporation, so that great thermal energy is applied during the pulverization of a pigment by drying. As a result, the pigment usually forms an aggregate (secondary grains) into which primary grains gather.

It is not easy to disperse the pigment forming such an aggregate in the form of fine grains. For making a fine grain dispersion, it is desirable to treat in advance the pigment with resins of various kinds. As examples of a resin usable for such a purpose, mention may be made of binding resins as recited below. As a method for such a treatment, the flushing treatment and the kneading method using a kneader, an extruder, a ball mill or a two-rod or three-rod roll mill can be adopted. Of these treatments, the flushing treatment and the kneading method using a two-rod or three-rod roll mill are more suitable for fine pulverization of the pigment.

The flushing treatment is a method of treating a pigment with a resin, which usually comprises mixing an aqueous dispersion of pigment with a solution of resin in a water-immiscible solvent to extract the pigment from the aqueous medium into the organic medium. According to this method, the pigment undergoes no drying treatment, and so the pigment can be prevented from aggregating and the dispersion thereof becomes easy. The treatment of a pigment by the kneading method using a two-rod or three-rod roll mill comprises mixing the pigment with a resin or a resin solution and kneading the resultant mixture while imposing a high shear (shearing stress) thereon. In this kneading process, the resin coating is formed on the pigment surface, and thereby the aggregated pigment grains are dispersed into primary grains via aggregates of lower orders.

On the other hand, it is also advantageous to use a pigment processed by previously treating with, e.g., acrylic resin, vinyl chloride-vinyl acetate resin, maleic acid resin, ethyl cellulose resin or nitrocellulose resin. The suitable form such a processed pigment can take is the form of powder, paste, pellet or paste, in which the pigment and the resin are homogeneously dispersed. Additionally, it is undesirable for the processed pigment to assume the form of unequal clusters by gelation of the resin.

The dispersion of fine pigment grains having the desired grain size distribution can be prepared as follows: In the first place, the pigment is subjected to a flushing treatment or kneaded with a binding resin by means of a kneader, an extruder, a ball mill or a two-rod or three-rod roll mill. In accordance with a desirable kneading method, a solvent is added to the pigment and the resin, mixed homogeneously therewith, and then kneaded with a two-rod or three-rod roll mill, if necessary, under heating to fully familiarize the pigment with the binding resin. Thus, a uniformly colored matter is obtained. In the next place, the thus treated pigment is mixed with other constituents including the pigment dispersant for use in the invention, and then subjected to wet dispersion (primary dispersion). Then again, the dispersion obtained undergoes wet dispersion using more minute beads (secondary dispersion) till the desired grain size distribution is achieved. In another way, the grains having the desired average size and size distribution can be obtained by fractionating the dispersion obtained by wet dispersion by centrifugation, or removing coarse grains therefrom by decantation. Carrying out the forgoing kneading process and dispersing process in the presence of a dispersant, such as a tertiary amine compound, is advantageous for attaining the grain size distribution intended by the invention, because the formation and dispersion of finely grained pigment can be promoted by the presence of such a dispersant. In particular, the tertiary amine compound containing at least one polymeric group is well suited for the foregoing purpose. As to at least one polymeric group the tertiary amine compound can have, any group may be used as long as it contains at least one polymeric moiety. However, the lower alkyleneoxy groups are preferred as the polymeric group. Such a lower alkyleneoxy group includes polyoxyethylene and polyoxypropylene, preferably a block copolymer of polyoxyethylene and polyoxypropylene. The number of these polymeric groups attached to a tertiary amine may be any of 1, 2 and 3.

Further, conventional pigment dispersants and surfactants can be added for the purpose of enhancing the dispersibility of the pigments. As these dispersants can be used many kinds of compounds, including phthalocyanine derivatives (e.g., EFKA-745, trade name, a product of Morishita Sangyo); cationic surfactants, such as organosiloxane polymer, KP341 (trade name, a product of Shin-Etsu Chemical Co., Ltd.), (meth)acrylic acid polymers, Polyflow No. 75, No. 90 and No. 95 (trade names, products of Kyoei-sha Yushi Kagaku Kogyo), and W001 (trade name, a product of Yusho); nonionic surfactants, such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate and sorbitan fatty acid ester; fluorine-containing surfactants, such as Eftop EF301, EF303 and EF352 (trade names, products of Shin-Akita Kasei), Megafac F171, F172 and F173 (trade names, products of Dai-Nippon Ink & Chemicals, Inc.), and Fluorad FC430 and FC431 (trade names, products of Sumitomo 3M), Asahi Guard AG710, Surflon S382, SC-101, SC-102, SC-103, SC-104, SC-105and SC-1068 (trade names, products of Asahi Glass Company, Ltd.); anionic surfactants, such as W004, W005 and W017 (trade names, products of Yusho); polymeric dispersants, such as EFKA-46, EFKA-47, EFKA-47EA, EFKA POLYMER 100, EFKA POLYMER 400, EFKA POLYMER 401 and EFKA POLYMER 450 (trade names, products of Morishita Sangyo), and Disperse Aid 6, Disperse Aid 8, Disperse Aid 15 and Disperse Aid 9100 (trade names, products of San Nopco); various Solsperse dispersants, such as Sorsperse 3000, 5000, 9000, 12000, 13240, 13940, 17000, 24000, 26000 and 28000 (trade names, products of Zenaka K.K.); and other dispersants, such as Adekapulronic L31, F38, L42, L44, L61, L64, F68, L72, P95, F77, P84, F87, P94, L101, P103, F108, L121 and P-123 (trade names, products of Asahi Denka Kogyo K.K.), and Isonet S-20 (trade name, a product of Sanyo Chemical Industries Co., Ltd.)

The suitable conditions for the thus prepared pigment dispersion to be used practically are mentioned below.

The average grain size of the pigment is very important. When the pigment has a large average grain size, it causes undesirable light scattering. As a result, the photosensitive material containing such a pigment has a low transmittance, and so the light necessary for photopolymerization cannot reach to the inside of the photosensitive composition. The scattering is serious especially when light of short wavelengths is used as a light source. Accordingly, in the case of the photosensitive compositions intended for the use of a light source of relatively short wavelengths as in the invention, it is desirable that the average grain size of the pigment be as small as possible. The transmittance drop arising from the light scattering dependant on the grain size has considerable influence. Even if the absorption characteristics of the pigment are set up properly by selecting the structure of a coloring substance of the pigment so that the transmittance at 400 nm becomes greater, the transmittance at 400 nm is lowered so long as the pigment grains are large in size; as a result, a decrease in real sensitivity of the photosensitive composition is brought about. On the other hand, the pigment too small in grain size tends to have poor dispersion stability, thereby arising undesirable troubles, e.g., aggregation and precipitation, when incorporated in a photosensitive composition. From these viewpoints, it is desirable for the present pigment to have its average grain size in the range of 0.01 to 0.7 $\mu$m, preferably 0.01 to 0.4 $\mu$m.

To mention in more detail, it is desirable that the proportion of grains having sizes of no greater than 0.4 $\mu$m be at least 70 weight %, preferably 80 weight %, to the total grains and the average grain size be from 0.01 to 0.4 $\mu$m, preferably from 0.02 to 0.35 $\mu$m.

As to the amount of pigment used, the upper limit thereof is set so that no significant decrease in polymerization reactivity is caused in the photosensitive composition by the use of the pigment and, when the photosensitive composition is applied to a lithographic printing plate precursor, the pigment used therein causes no noticeable decrease in the development processability of the plate precursor. On the other hand, the lower limit of the amount of pigment used is set so that the pigment used has sufficient effect on the improvement in fogging characteristic of the photosensitive composition. These limits depend on the optical characteristics of each individual pigment. When the present photosensitive composition is used as a photosensitive layer provided on a support, the amount of pigment used is generally from 0.001 to 5 $g/m^2$, preferably from 0.05 to 3 $g/m^2$, particularly preferably from 0.1 to 2 $g/m^2$. In view of optical characteristics, on the other hand, excellent fogging characteristic can be obtained when the absorbance of the photosensitive layer at 500 nm, which is attributed to the pigment incorporated therein, is at least 0.1, preferably at least 0.3, particularly preferably at least 0.5.

As to other suitable conditions for the pigment to be used practically, a variety of conventional arts can be employed. In particular, as disclosed in JP-A-8-101498, the photosensitive layer having high sensitivity can be obtained by dispersing a pigment in the presence of a polymer having an aliphatic double bond in the main chain or any of side chains. In addition, the proposals hitherto made for the use of pigments in a photopolymerization system can be found, e.g., in JP-A-10-282647 and JP-A-9-230601.

Titanocene Compounds

In the next place, Component (i) essential for the present photosensitive composition, namely titanocene compounds, which is second in importance to the invention, are illustrated below.

The titanocene compounds used as a component essential for the present photosensitive composition may be any of known titanocene compounds as far as they can produce active species upon exposure to light, if needed, in the presence of sensitizing dyes as mention hereinafter. Such titanocene compounds can be selected properly from the known compounds as disclosed in JP-A-59-152396, JP-A-61-151197, JP-A-63-41483, JP-A-63-41484, JP-A-2-249, JP-A-2-291, JP-A-3-27393, JP-A-3-12403 and JP-A-6-41170.

More specifically, the titanocene compounds usable in the invention include di(cyclopentadienyl)-Ti-dichloride, di(cyclopentadienyl)-Ti-bisphenyl, di(cyclopentadienyl)-Ti-bis(2,3,4,5,6-pentafluorophen-1-yl), di(cyclopentadienyl)-Ti-bis(2,3,5,6-tetrafluorophen-1-yl), di(cyclopentadienyl)-Ti-bis(2,4,6-trifluorophen-1-yl), di(cyclopentadienyl)-Ti-bis(2,6-difluorophen-1-yl), di(cyclopentadienyl)-Ti-bis(2,4-difluorophen-1-yl), di(methylcyclopentadienyl)-Ti-bis(2,3,4,5,6-pentafluorophen-1-yl), di(methylcyclo-pentadienyl)-Ti-bis(2,3,5,6-tetrafluorophen-1-yl), di(methylcyclopentadienyl)-Ti-bis(2,4-difluorophen-1-yl), and bis(cyclopentadienyl)bis(2,6-difluoro-3-(pyren-1-yl)phenyl)titanium.

In applying the present photosensitive composition to the photosensitive layer of a lithographic printing plate precursor, the titanocene compounds as recited above can undergo various chemical modifications for improving characteristics of the photosensitive layer. Examples of a modification method usable therein include the binding to a sensitizing dye as mentioned hereinafter, an addition polymerizing unsaturated compound or another active agent part, the introduction of a hydrophilic moiety, the introduction of a substituent group for enhancing the compatibility and inhibiting crystals from separating out, the introduction of a substituent group for raising the adhesiveness, and the polymer formation.

In addition, the way of using titanocene compounds can be selected properly depending on the efficiency design for a photosensitive material to which they are applied. For instance, the combined use of two or more compounds can increase the compatibility with other contituents of the foregoing photosensitive layer. In general the use of titanocene compounds in a large amount is advantageous from the viewpoint of sensitivity. Sufficient sensitivity can be achieved by using the titanocene compounds in an amount of 0.5 to 80 parts by weight, preferably 1 to 50 parts by weight, per 100 parts by weight of the total constituents of the photosensitive layer. When the photosensitive composition is handled under a yellow or white light, on the other hand, it is desirable to use titanocene compounds in a small amount from the viewpoint of fog generation by light of wavelengths around 500 nm. For instance, even when the amount of titanocene compounds used is reduced to 6 parts by weight or below, further to 1.9 parts by weight or below, furthermore to 1.4 parts by weight or below, satisfactory sensitivity can be attained by using the titanocene compounds in combination with the sensitizing dyes as described hereinafter to raise the sensitivity of the photoinitiation system.

Addition Polymerizable Compounds

Then, Component (ii) essential for the present photosensitive composition, namely the addition polymerizable compounds containing at least one ethylenic unsaturated double bond in each molecule (hereinafter simply referred to as "addition polymerizable compound"), which is third in importance to the invention, are illustrated below.

The addition polymerizable compound (ii) as an essential component of the present photosensitive composition is selected from the compounds having at least one, preferably at least two, terminal ethylenic unsaturated bonds per molecule. The group of such compounds is widely known in this industrial field, and they can be used in the invention without any particular limitations. These compounds can take any of chemical forms, including a monomer, a prepolymer, such as a dimer, a trimer and an oligomer, a mixture thereof and a copolymer thereof. Examples of a solo monomer and monomers constituting a copolymer include unsaturated carboxylic acids (e.g., acrylic acid, methacrylic acid, itaconic acid, crotonic acid, isocrotonic acid, maleic acid), esters thereof and amides thereof, preferably esters produced from unsaturated carboxylic acids and aliphatic polyhydric alcohols, and amides produced from unsaturated carboxylic acids and aliphatic polyamine compounds. Further, the addition products prepared from esters or amides of unsaturated carboxylic acids having nucleophilic substituents, such as hydroxyl, amino and mercapto groups, and monofunctional or polyfunctional isocyanates or epoxides, and dehydrocondensation products prepared from the foregoing esters or amides and monofunctional or polyfunctional carboxylic acids are also suitable for the addition polymerizable compound (ii). Furthermore, the addition products prepared from unsaturated carboxylic acid esters or amides having electrophilic substitutents, such as isocyanato and epoxy groups, and monofunctional or polyfunctional alcohols, amines or thiols, and substitution products prepared from unsaturated carboxylic acid esters or amides having eliminable groups, such as halogen and tosyloxy groups, and monofunctional or polyfunctional alcohols, amines or thiols are also used to advantage. As other examples of usable compounds, mention may be made of the group of the compounds as recited above, however, the unsaturated carboxylic acids of which are replaced by unsaturated phosphonic acids, styrene or vinyl ether.

Examples of an ester monomer formed from an aliphatic polyhydric alcohol and unsubstituted carboxylic acid include acrylic acid esters, such as ethylene glycol diacrylate, triethylene glycol diacrylate, 1,3-butanediol diacrylate, tetramethylene glycol diacrylate, propylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylatae, tetraethylene glycol diacrylate, pentaerythritol diacrylate, pentaerythiritol triacrylate, pentaerythritol tetraacrylate, dipentaerythritol diacrylate, dipentaerythritol hexaacrylate, sorbitol triacrylate, sorbitol tetraacrylate, sorbitol pentacrylate, sorbitol hexacrylate, tri(acryloyloxyethyl)-isocyanurate and polyester acrylate oligomates; methacrylic acid esters, such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sosrbitol tetramethacrylate, bis{p-(3-methacryloxy-2-hydroxypropoxy)phenyl}dimethylmethane and bis{p-(methacryloxyethoxy)phenyl}dimethylmethane; itaconic acid esters, such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate; crotonic acid esters, such as ethylene glycol dicrotonate, tetramethylene glycol dicrotonate, pentaerythritol dicrotonate and sorbitol tetracrotonate; isocrotonic acid esters, such as ethylene glycol diisocrotonate, pentaerythritol diisocrotonate and sorbitol tetraisocrotonate; and maleic acid esters, such as ethylene glycol dimaleate, triethylene glycol dimaleate and sorbitol tetramaleate.

As other examples of esters, the aliphatic alcohol esters disclosed in JP-B-46-27926, JP-B-5147334 and A-57-196231, the esters having aromatic skeletons disclosed in JP-A-59-5240, JP-A-5241 and JP-A-2-226149, and the amino group-containing esters disclosed in JP-A-1-165613 can be suitably employed.

Further, the ester monomers as recited above can be use as mixture of two or more thereof.

Examples of amide monomers formed from aliphatic polyamide compounds and unsaturated carboxylic acids include methylenebis(acrylic amide), methylenebis (methacrylic amide), 1,6-hexamethylenebis(acrylic amide), 1,6-hexamethylenebis(methacrylic amide), diethylenetriaminetris(acrylic amide), xylylenebis(acrylic amide) and xylylenebis(methacrylic amide).

As examples of other suitable amide monomers, mention may be made of those having a cyclohexylene structure as disclosed in JP-B-54-21726.

Further, the addition polymerizable urethane compounds produced by utilizing the addition reaction of an isocyanate and a hydroxyl group are suitably used. Examples of such compounds include the vinylurethane compounds containing at least two polymerizable vinyl groups per molecule, which are produced by addition of hydroxyl group-containing vinyl monomers represented by the following formula (I) to the polyisocyanate compounds containing at least two isocyanate groups per molecule as disclosed in JP-B-48-41708:

$$CH_2=C(R)COOCH_2CH(R')OH \quad (I)$$

wherein R and R' are each H or $CH_3$.

In addition, the urethane acrylates disclosed in JP-A-51-37193, JP-B-2-32293 and JP-B-2-16765, and the ethylene oxide skeleton-containing urethane compounds disclosed in JP-B-58-49860, JP-B-56-17654, JP-B-62-39417 and JP-B-62-39418 are also suitable.

Furthermore, it is possible to confer a very high sensitization speed on the photosensitive composition by using the addition polymerizable compounds having an amino or sulfide structure within each molecule as disclosed in JP-A-63-277653, JP-A-63-260909 and JP-A-1-105238.

As other examples of suitable addition polymerizable compounds, mention may be made of the polyfunctional acrylates and methacrylates as disclosed in JP-A-48-64183, JP-B-49-43191 and JP-B-52-30490, such as polyester acrylates and epoxy acrylates produced by the reaction of epoxy resins with (meth)acrylic acid. In addition, the particular unsaturated compounds disclosed in JP-B-46-43946, JP-B-1-40337 and JP-B-1-40336, and the vinylphosphonic acid compounds disclosed in JP-A-2-25493 are also usable. In some cases, it is appropriate to introduce the perfluoroalkyl group-containing structures disclosed in JP-A-61-22048. Also, it is possible to employ the addition polymerizable compounds presented as photosetting monomers or oligomers in Nippon Settyaku Kyokai-shi (which means "Journal of Japanese Adhesion Association"), vol. 20, No. 7, pp. 200–308 (1984).

The detailed directions for using addition polymerizable compounds, concerning, e.g., what structures of compounds should be used, whether to use them independently or in combination and how much to add them, can be chosen arbitrarily so far as the properties designed for the finished photosensitive material are attained thereby. More specifically, the determination of those factors are made taking the following viewpoints into consideration. With respect to the sensitization speed, it is desirable for the structure to be high in unsaturated group content per molecule and, in many cases, it is preferable to be bifunctional or above. In order to heighten the strength of the image area, or the cured film, it is desirable for the addition polymerizable compounds to be trifunctional or above. Further, it is also effective to control both sensitivity and strength by the combined use of two or more addition polymerizable compounds differing from one another in number of functional groups and kind of polymerizable group (e.g., acrylic acid esters, methacrylic acid esters, styrene compounds, vinyl ether compounds). The compounds having high molecular weight or high hydrophobicity, though superior in sensitization speed and film strength, are undesirable in some instances because they tends to lower the development speed and cause precipitation in a developing solution. In addition, the compatibility of addition polymerizable compounds with other components in the photosensitive layer (e.g., a binder polymer, an initiator, coloring agent) and their dispersibility in the photosensitive layer constitute other important factors in their selection and the directions as to how to use them. For instance, it is possible to increase the compatibility by the use of low-purity compounds or the combined use of two or more compounds. When the present photosensitive composition is used for the photosensitive layer of a lithographic printing plate precursor, it is likely that the compounds having particular structures are selected for the purpose of enhancing the adhesiveness of the photosensitive layer to a support and an overcoat layer as mentioned hereinafter. As to the proportion of addition polymerizable compounds in the photosensitive layer, it is advantageous from the viewpoint of sensitivity to incorporate them in higher proportions. However, their incorporation in too high proportions brings troubles, such that it causes undesirable phase separation, renders the photosensitive layer tacky to bring troubles in the production process (e.g., defective production arising from transfer and adhesion of components in the photosensitive material), and gives rise to precipitates in the developer. From these points of view, the suitable proportion of addition polymerizable compounds is, in many cases, from 5 to 80 weight %, preferably from 25 to 75 weight %, to the total components in the photosensitive composition. Therein, the addition polymerizable compounds may be used alone or in combination of two or more thereof. As to the other directions for using addition polymerizable compounds, it is possible to select their structures, compounding proportions and addition amount properly taking into account the extent of inhibition of polymerization by oxygen, resolution, fogging tendency, change in refractive index, and surface tackiness. In some instances, the layer structure having an undercoat or a final coat may be taken, and the method of providing such coats may be adopted.

Other Components

In the present photosensitive composition may further be contained other components suitable for its end use purpose and production method.

Sensitizing Dyes

To the present photosensitive composition, it is desirable to add sensitizing dyes, if desired, for the purpose of increasing the sensitivity. When these sensitizing dyes are used in combination with the foregoing titanocene compounds, the resulting combination is referred to as a photo-initiation system. The sensitizing dyes suitable for the foregoing purpose are those having a light absorption characteristic that they exhibit greater absorbance at 400 nm than at 500 nm when incorporated in the photosensitive composition. The sensitizing dyes employed more effectively for the foregoing purpose are those having a spectral sensitivity characteristic that they have their maximal sensitization wavelengths in the wavelength range shorter than 430 nm and longer than 300 nm, preferably shorter than 430 nm and longer than 350 nm. Any sensitizing dyes can be used in the invention as far as they have the aforementioned characteristics.

Examples of sensitizing dyes having those characteristics include merocyanine dyes represented by the following formula (1), styryl dyes represented by the following formula (2), benzopyrans and coumarins represented by the following formula (3), aromatic ketones represented by the following formula (4) and anthracenes represented by the following formula (5):

(1)

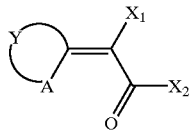

(wherein A represents a sulfur atom or $NR_1$, $R_1$ represents a univalent nonmetal atomic group, Y represents a nonmetal atomic group forming a dye's basic nucleus in association with the adjacent A and the adjacent carbon atom, and $X_1$ and $X_2$ each represent a univalent nonmetal atomic group or they combine with each other to complete a dye's acidic nulceus)

(2)

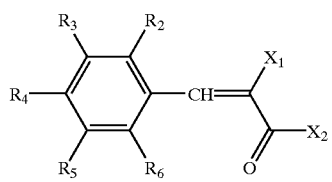

(wherein $X_1$ and $X_2$ have the same meanings as those in formula (1) respectively, and each of $R_2$ to $R_6$ represents a univalent nonmetal atomic group, but it is preferable that at least one of them represents an electron-donating substituent group having a negative Hammett's c value)

(3)

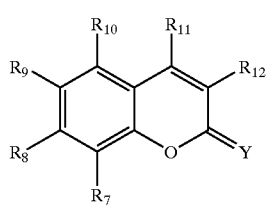

Partial structural formula (i)

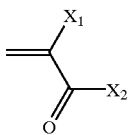

(wherein =Y represents =O, =S, an imino group or an alkylidene group represented by the foregoing formula (i), $X_1$ and $X_2$ have the same meanings as those in formula (1) respectively, and each of R7 to R12 represents a univalent nonmetal atomic group)

(4)

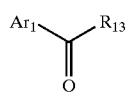

(wherein $Ar_1$ represents an unsubstituted or substituted aryl or heteroaryl group, and $R_{13}$ represents a univalent nonmetal atomic group, preferably an aryl or heteroaryl group, or it combines with $Ar_1$ to form a ring)

(5)

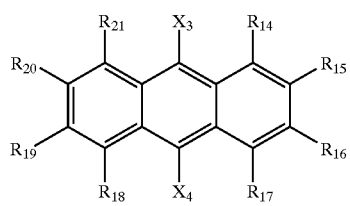

(wherein $X_3$, $X_4$ and $R_{14}$ to $R_{21}$ each represent a univalent nonmetal atomic group, but it is desirable that $X_1$ and $X_2$ each be an electron-donating group having a negative σ value).

Suitable examples of a univalent nonmetal atomic group represented by each of $X_1$, $X_2$ and $R_1$ to $R_{21}$ include a hydrogen atom, alkyl groups (such as methyl group, ethyl group, propyl group, butyl group, pentyl group, hexyl group, heptyl group, octyl group, nonyl group, decyl group, undecyl group, dodecyl group, tridecyl group, hexadecyl group, octadecyl group, eicosyl group, isopropyl group, isobutyl group, s-butyl group, t-butyl group, isopentyl group, neopentyl group, 1-methylbutyl group, isohexyl group, 2-ethylhexyl group, 2-methylhexyl group, cyclohexyl group, cyclopentyl group, 2-norbornyl group, chloromethyl group, bromomethyl group, 2-chloroethyl group, trifluoromethyl group, methoxymethyl group, methoxyethoxyethyl group, allyloxymethyl group, phenoxymethyl group, methylthiomethyl group, tolylthiomethyl group, ethylaminoethyl group, diethylaminopropyl group, morpholinopropyl group, acetyloxymethyl group, benzoyloxymethyl group, N-cyclohexylcarbamoyloxyethyl group, N-phenylcarbamoyloxyethyl group, acetylaminoethyl group, N-methylbenzoylaminopropyl group, 2-oxoethyl group, 2-oxopropyl group, carboxypropyl group, methoxycarbonylethyl group, allyloxycarbonylbutyl group, chlorophenoxycarbonylmethyl group, carbamoylmethyl group, N-methylcarbamoylethyl group, N,N-dipropylcarbamoylmethyl group, N-(methoxyphenyl)-carbamoylethyl group, N-methyl-N-(sulfophenyl)

carbamoyl-methyl group, sulfobutyl group, sulfonatobutyl group, sulfamoylbutyl group, N-ethylsulfamoylmethyl group, N,N-dipropylsulfamoylpropyl group, N-tolylsulfamoylpropyl group, N-methyl-N-(phosphonophenyl)sulfamoyloctyl group, phosphonobutyl group, phosphonatohexyl group, diethylphosphonobutyl group, diphenylphosphonopropyl group, methylphosphonobutyl group, methylphosphonatobutyl group, tolylphosphonohexyl group, tolylphosphonatohexyl group, phosphonoxypropyl group, phosphonatoxybutyl group, benzyl group, phenetyl group, α-methylbenzyl group, 1-methyl-1-phenylethyl group, p-methylbenzyl group, cinnamyl group, allyl group, 1-propenylmethyl group, 2-butenyl group, 2-methylallyl group, 2-methylpropenylmethyl group, 2-propynyl group, 2-butynyl group, and 3-butynyl group), aryl groups (such as phenyl group, biphenyl group, naphthyl group, tolyl group, xylyl group, mesityl group, cumenyl group, chlorophenyl group, bromophenyl group, chloromethylphenyl group, hydroxyphenyl group, methoxyphenyl group, ethoxyphenyl group, phenoxyphenyl group, acetoxyphenyl group, benzoyloxyphenyl group, methylthiophenyl group, phenylthiophenyl group, methylaminophenyl group, dimethylaminophenyl group, acetylaminophenyl group, carboxyphenyl group, methoxycarbonylphenyl group, ethoxycarbonyl phenyl group, phenoxycarbonylphenyl group, N-phenylcarbamoylphenyl group, cyanophenyl group, sulfophenyl group, sulfonatophenyl group, phosphonophenyl group, and phosphonatophenyl group), heteroaryl groups (such as groups respectively derived from thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthyridine, quinazoline, cinnoline, quinoline, pteridine, carbazole, carboline, phenanthridine, acridine, perimidine, phenanthroline, phthalazine, phenarsazine, phenoxazine, furazan and phenoxthine), alkenyl groups (such as vinyl group, 1-propenyl group, 1-butenyl group, cinnamyl group, and 2-chloro-1-ethenyl group), alkynyl groups (such as ethynyl group, 1-propynyl group, 1-butynyl group, and trimethylsilylethynyl group), halogen atoms (such as F, Br, Cl and I), a hydroxyl group, alkoxy groups, aryloxy groups, a mercapto group, alkylthio groups, arylthio groups, alkyldithio groups, aryldithio groups, an amino group, N-alkylamino groups, N,N-dialkylamino groups, N-arylamino groups, N,N-diarylamino groups, N-alkyl-N-arylamino groups, acyloxy groups, a carbamoyloxy group, N-alkylcarbamoyloxy groups, N-arylcarbamoyloxy groups, N,N-dialkylcarbamoyloxy groups, N,N-diarylcarbamoyloxy groups, N-alkyl-N-arylcarbamoyloxy groups, alkylsulfoxy groups, arylsulfoxy groups, acylthio groups, acylamino groups, N-alkylacylamino groups, N-arylacylamino groups, an ureido group, N'-alkylureido groups, N',N'-dialkylureido groups, N'-arylureido groups, N',N'-diarylureido groups, N'-alkyl-N'-arylureido groups, N-alkylureido groups, N-arylureido groups, N'-alkyl-N-alkylureido groups, N'-alkyl-N-arylureido groups, N',N'-dialkyl-N-alkylureido groups, N',N'-dialkyl-N-arylureido groups, N'-aryl-N-alkylureido groups, N'-aryl-N-arylureido groups, N7,N'-diaryl-N-alkylureido groups, N',N'-diaryl-N-arylureido groups, N'-alkyl-N'-aryl-N-alkylureido groups, N'-alkyl-N'-aryl-N-arylureido groups, alkoxycarbonylamino groups, aryloxycarbonylamino groups, N-alkyl-N-alkoxycarbonylamino groups, N-alkyl-N-aryloxycarbonylamino groups, N-aryl-N-alkoxycarbonylamino groups, N-aryl-N-aryloxycarbonylamino groups, a formyl group, an acyl group, a carboxyl group, an alkoxycarbonyl group, aryloxycarbonyl groups, a carbamoyl group, N-alkylcarbamoyl groups, N,N-dialkylcarbamoyl groups, N-arylcarbamoyl groups, N,N-diarylcarbamoyl groups, N-alkyl-N-arylcarbamoyl groups, alkylsulfinyl groups, arylsulfinyl groups, alkylsulfonyl groups, arylsulfonyl groups, a sulfo group (—SO$_3$H) and conjugate base groups thereof (hereinafter referred to as sulfonato groups), alkoxysulfonyl groups, aryloxysulfonyl groups, a sulfinamoyl group, N-alkylsulfinamoyl groups, N,N-dialkylsulfinamoyl groups, N-arylsulfinamoyl groups, N,N-diarylsulfinamoyl groups, N-alkyl-N-arylsulfinamoyl groups, a sulfamoyl group, N-alkylsulfamoyl groups, N,N-dialkylsulfamoyl groups, N-arylsulfamoyl groups, N,N-diarylsulfamoyl groups, N-alkyl-N-arylsulfamoyl groups, a phosphono group (—PO$_3$H$_2$) and conjugate base groups thereof (hereinafter referred to as phosphonato groups), dialkylphosphono groups (—PO$_3$(alkyl)$_2$), diarylphosphono groups (—PO$_3$(aryl)$_2$), alkylarylphosphono groups (—PO$_3$(alkyl)(aryl)), monoalkylphosphono groups (—PO$_3$H(alkyl)) and conjugate base groups thereof (hereinafter referred to as alkylphosphonato groups), monoarylphosphono groups (—PO$_3$H(aryl)) and conjugate base groups thereof (hereinafter referred to as arylphosphonato groups), a phosphonoxy group (—OPO$_3$H$_2$) and conjugate base groups thereof (hereinafter referred to as phosphonatoxy groups), dialkylphosphonoxy groups (—OPO$_3$(alkyl)$_2$), diarylphosphonoxy groups (—OPO$_3$(aryl)$_2$), alkylarylphosphonoxy groups (—OPO$_3$(alkyl)(aryl)), monoalkylphosphonoxy groups (—OPO$_3$H(alkyl)) and conjugate base groups thereof (hereinafter referred to as alkylphosphonatoxy groups), monoarylphosphonoxy groups (—OPO$_3$H(aryl)) and conjugate base groups thereof (hereinafter referred to as arylphosphonatoxy groups), a cyano group, and a nitro group. Of these substituent groups, a hydrogen atom, alkyl groups, aryl groups, halogen atoms, alkoxy groups and acyl groups are preferred over the others.

Examples of the basic nucleus of a dye represented by formula (1), which Y forms in association with the adjacent A and the adjacent carbon atom, include 5-, 6- or 7-membered nitrogen- or sulfur-containing heterocyclic rings, preferably 5- or 6-membered heterocyclic rings.

The nitrogen-containing heterocyclic rings suitably used for such a basic nucleus include all of those known to constitute the basic nuclei of merocyanine dyes as described, e.g., in L. G. Brooker et al., *J. Am. Chem. Soc.*, 73, 5326–5358 (1951) and the references cited therein. As examples of such nitrogen-containing heterocyclic rings, mention may be made of thiazoles (such as thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenylthiazole), and 4-(2-thienyl)thiazole), benzothiazoles (such as benzothiazole, 4-chlorobenzothiazole, 5-chlorobenzothiazole, 6-chloro-benzothiazole, 7-chlorobenzothiazole, 4-methylbenzothiazole, 5-methylbenzothiazole, 6-methylbenzothiazole, 5-bromobenzo-thiazole, 4-phenylbenzothiazole, 5-phenylbenzothiazole, 4-methoxybenzothiazole, 5-methoxybenzothiazole, 6-methoxy-benzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylenebenzothiazole, 5-hydroxybenzothiazole, 6-hydroxybenzothiazole, 6-dimethylaminobenzothiazole, and 5-ethoxycarbonylbenzothiazole), naphthothiazoles (such as naphtho[1,2]thiazole, naphtho[2,1]thiazole, 5-methoxy-naphtho[2,1]thiazole, 5-ethoxynaphtho[2,1] thiazole, 8-methoxynaphtho[1,2]thiazole, and 7-methoxynaphtho[1,2]-thiazole), thianaphtheno-7',6',4,5-thiazoles (such as 4'-methoxythianaphtheno-7',6',4,5-thiazole), oxazoles (such as 4-methyloxazole, 5-methyloxazole, 4-phenyloxazole, 4,5-diphenyloxazole, 4-ethyloxazole, 4, 5-dimethyloxazole, and 5-phenyloxazole), benzoxazoles (such as benzoxazole, 5-chlorobenzoxazole, 5-methylbenzoxazole, 5-phenylbenzoxazole, 6-methylbenzoxazole, 5,6-dimethylbenzoxazole, 4,6-dimethyl-benzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole, and 6-hydroxybenzoxazole), naphotoxazoles (such as naphtho[1,2] oxazole, and naphtho[2,1]oxazole), selenazoles (such as 4-methyl-selenazole, and 4-phenylselenazole), benzoselenazoles (such as benzoselenazole, 5-chlorobenzoselenazole, 5-methoxybenzo-selenazole, 5-hydroxybenzoselenazole, and tetrahydrobenzo-selenazole), naphthoselenazoles (such as naphtho[1,2]-selenazole, and naptho[2,1]selenazole), thiazolines (such as thiazoline, and 4-methylthiazoline), 2-quinolines (such as quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline, and 8-hydroxyquinoline), 4-quinolines (such as quinoline, 6-methoxyquinoline, 7-methylquinoline, and 8-methylquinoline), 1-isoquinolines (such as isoquinoline, and 3,4-dihydroisoquinoline), 3-isoquinolines (such as isoquinoline), benzimidazoles (such as 1,3-diethyl-benzimidazole, and 1-ethyl-3-phenylbenzimidazole), 3,3,-dialkylindolenines (such as 3,3-dimethylindolenine, 3,3,5-trimethylindolenine, and 3,3,7-trimethylindolenine), 2-pyridines (such as pyridine, and 5-methylpyridine) and 4-pyridines (such as pyridine).

The sulfur-containing heterocyclic rings suitable for the dye's basic nucleus are, e.g., the dithiol partial structures in the dyes disclosed in JP-A-3-296759. Examples of such partial structures include benzodithiols (such as benzodithiol, 5-t-butylbenzodithiol, and 5-methylbenzodithiol), naphthodithiols (such as naphtho[1,2]dithiol, and naphtho[2,1]dithiol) and dithiols (such as 4,5-dimethnyldithiols, 4-phenyldithiols, 4-methoxycarbonyldithiols, 4,5-dimethoxycarbonylbenzodithiols, 4,5-ditrifluoromethyldithiol, 4,5-dicyanodithiol, 4-methoxycarbonylmethyldithiol, and 4-carboxymethyldithiol).

In the foregoing illustration of heterocyclic rings, as is the custom, the names of mother skeletons of heterocyclic rings are used for convenience's sake. However, when the heterocyclic ring constitutes the partial structure of the basic skeleton in each sensitizing dye, it is introduced in the form of a substituent group of alkylidene type which is lower in unsaturation degree by one. For instance, the benzothiazole skeleton is introduced in the form of a 3-substituted-2(3H)-benzothiazolylidene group.

More specific examples of sensitizing dyes represented by formulae (1) to (5) respectively are illustrated below, but the sensitizing dyes usable in the invention should not be construed as being limited to these examples.

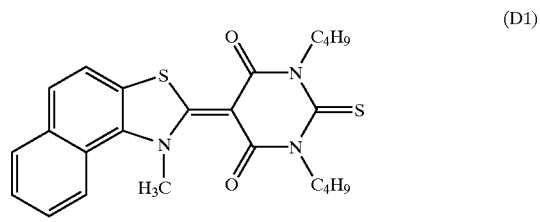

(D1)

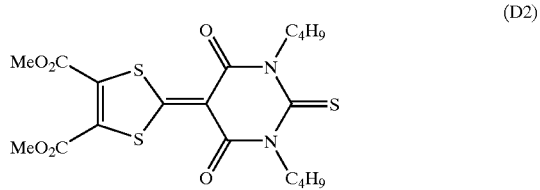

(D2)

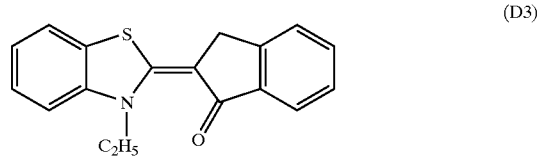

(D3)

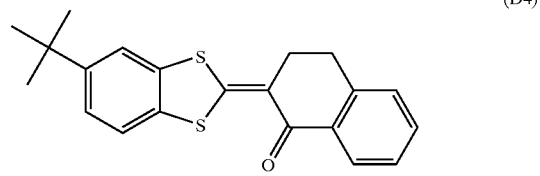

(D4)

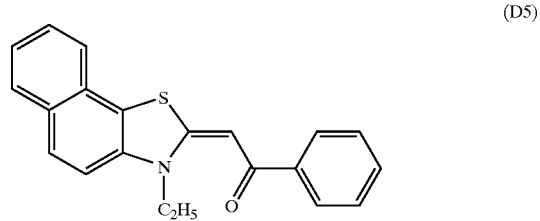

(D5)

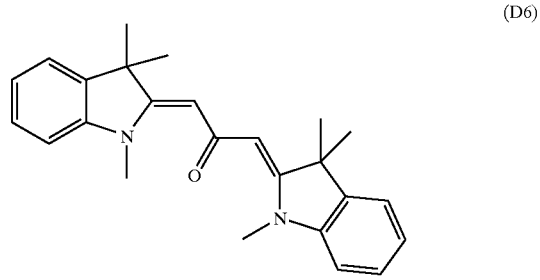

(D6)

-continued
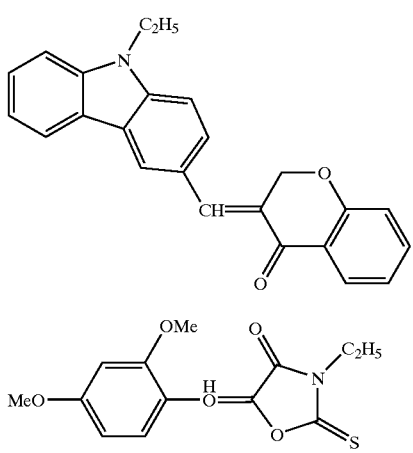
(D7)
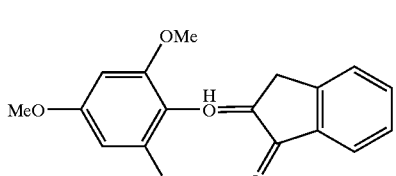
(D8)
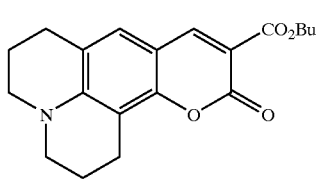
(D9)
(D10)
(D11)
(D12)
(D13)
(D14)
-continued
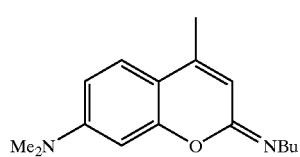
(D15)
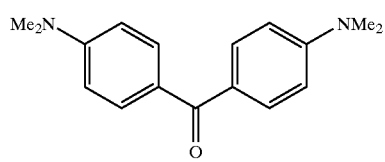
(D16)
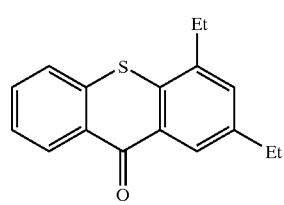
(D17)
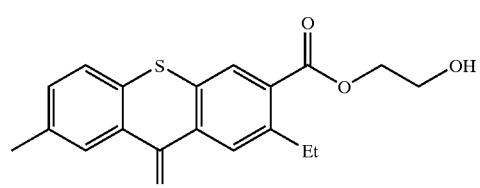
(D18)
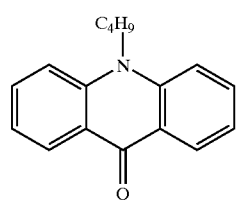
(D19)
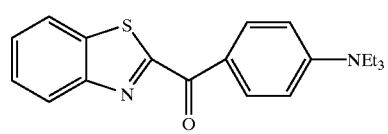
(D20)
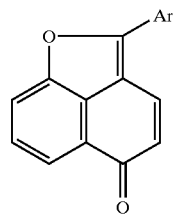
(D21)
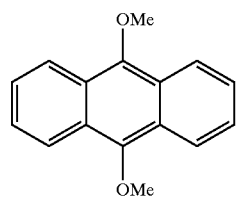
(D22)
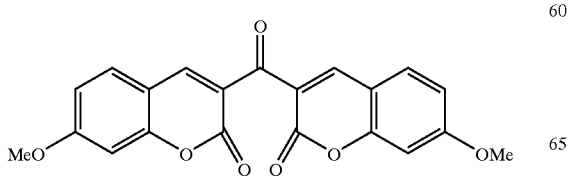

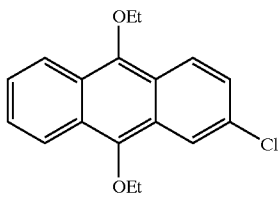
(D23)

In using the present photosensitive composition for the photosensitive layer of a lithographic printing plate precursor, it is possible to further make various chemical modifications to the sensitizing dyes as recited above for the purpose of improving the characteristics of the sensitive layer. For instance, the increase in film strength of the exposed photosensitive layer and the prevention of unnecessary separation of the sensitizing dyes as recited above from the exposed photosensitive layer can be effected when the addition polymerizable compound structure as mentioned above (such as acryloyl or methacryloyl group) is linked to the dyes by a covalent, ionic or hydrogen bond. In another case, it is possible to markedly enhance the sensitivity, particularly under a condition that the photoinitiator system concentration is low, by making the sensitizing dye as recited above bind to the titanocene compound as recited above and a radical generation part (such as a reduction decomposable part, e.g., halogenated alkyl, onium, peroxide or biimidazole, or an oxidation cleavable part, e.g., borate, amine, trimethylsilylmethyl, carboxymethyl, carbonyl or imine). Further, the introduction of a hydrophilic part (such as an acidic group or a polar group, including carboxyl group or an ester thereof, sulfonic acid group or an ester thereof, and an ethyleneoxide group) is effective in heightening the suitability for the processing with an (alkaline) aqueous developer as a preferred mode of processing the photosensitive layer of a lithographic printing plate precursor to which the present photosensitive composition is applied. In particular, the hydrophilic group of ester type has an advantage in that it has high compatibility in the photosensitive layer because of its comparatively hydrophobic structure, and besides, it produces an acidic group by hydrolysis in a developer to increase its hydrophilicity. In addition, various substituent groups can be introduced to the sensitizing dyes for the purpose of enhancing the compatibility and preventing the crystallization in the photosensitive layer. For instance, the introduction of an unsaturated group, such as an aryl or allyl group, is very effective for the compatibility improvement in some photosensitive systems, and the introduction of a branched alkyl structure provides a steric hindrance between π-planes of the dye to effectively inhibit the dye from depositing as crystals. On the other hand, the introduction of a phosphonic acid group, an epoxy group or a trialkoxysilyl group can improve the adhesiveness to inorganic materials, such as metals and metal oxides. Also, the methods of modifying the sensitizing dyes into polymeric ones can be employed depending on the desired purpose.

The detailed directions for using these sensitizing dyes, concerning, e.g., what structures should be introduced in them, whether to use them independently or in combination and how much to add them, can be set properly so as to realize the properties designed for the finished photosensitive material. More specifically, when the present photosensitive composition is used for the photosensitive layer of a lithographic printing plate precursor, the combined use of at least two kinds of sensitizing dyes can heighten the compatibility with other components in the photosensitive layer. In selecting sensitizing dyes, not only their sensitivities but also their molar extinction coefficients at the emission wavelengths of a light source constitute important factors. The use of sensitizing dyes large in molar extinction coefficient can significantly lessen their addition amount, so it is economical, and besides, advantageous from the viewpoint of physical properties of the photosensitive layer. When the present photosensitive composition is used for the photosensitive layer of a lithographic printing plate precursor, the sensitivity and resolution of the photosensitive layer and the physical properties of the exposed photosensitive layer are greatly influenced by the absorbance at the wavelengths of a light source used. Therefore, the addition amount of sensitizing dyes are properly chosen taking those factors into account. For instance, the low absorbance of 0.1 or below causes a sensitivity drop. And the halation occurs in such a low absorbance range to lower the resolution. In some instances, however, such a low absorbance can rather increase the curing degree when the thick film having a thickness of at least 5 μm is cured. In the high absorbance range of 3 or above, on the other hand, most of incident light is absorbed at the surface of the photosensitive layer, and thereby the curing inside the photosensitive layer is impeded. When such a photosensitive layer constitute a printing plate, it cannot have sufficient film strength and adhesion to the substrate. In a special case that the present photosensitive composition is used for a lithographic printing plate having a comparatively thin film thickness, it is desirable to determine the amount of sensitizing dyes added so that the absorbance of the photosensitive layer is in the range of from 0.1 to 1.5, preferably from 0.25 to 1. To mention more concretely, the sensitizing dyes are added to the photosensitive layer of a lithographic printing plate in an amount of generally from 0.05 to 30 parts, preferably from 0.1 to 20 parts, particularly preferably from 0.2 to 10 parts, per 100 parts of the total components in the photosensitive layer.

Binder Polymer

In a case where the present photosensitive composition is applied to a lithographic printing plate precursor, which is a preferred mode for carrying out the invention, it is desirable for the photosensitive layer of the plate precursor to further contain a binder polymer. For this binder polymer, the linear organic high polymers are suitable. And any of known ones may be used herein. However, it is advantageous to select linear organic high polymers which are soluble or can swell in water or faintly alkaline water, because the development with water or faintly alkaline water becomes possible. These linear organic high polymers are used as film forming agent, but what kind of polymers should be used depends on the species of a developer used, in other words, which developer, water, faintly alkaline water or an organic solvent, is employed. For instance, water development becomes possible by using water-soluble organic high polymers. Examples of such linear organic high polymers include addition polymers having carboxylic acid groups in the side chains as disclosed, e.g., in JP-A-59-44615, JP-B-54-34327, JP-B-58-12577, JP-B-54-25957, JP-A-54-92723, JP-A-59-53836 and JP-A-59-71048, more specifically methacrylic acid copolymers, acrylic acid copolymers, itaconic acid copolymers, crotonic acid copolymers, maleic acid copolymers and partially esterified maleic acid copolymers. As other examples of such high polymers, mention may be made of acidic cellulose derivative having carboxylic acid groups in the side chains. In addition, the hydroxyl group-containing addition polymers to which cyclic acid anhydrides are further added are also useful.

Of these polymers, the copolymers of benzyl (meth) acrylate, (meth)acrylic acid and, if needed, other addition polymerizable vinyl monomers, and the copolymers of allyl (meth) acrylate, (meth) acrylic acid and, if needed, other addition polymerizable vinyl monomers are preferred in particular because they can ensure a good balance between film strength, sensitivity and developability.

In addition, the binder polymers of acidic group-containing urethane type as disclosed in JP-B-7-12004, JP-B-7-120041, JP-B-7-120042, JP-B-8-12424, JP-A-63-287944, JP-A-63-287947, JP-A-1-271741 and Japanese Patent Application No. 10-116232 are decidedly superior in film strength, so that they carry advantages in press life and low-intensity exposure suitability.

And the amido group-containing binders disclosed in Japanese Patent Application No. 9-353195 can ensure both excellent developability and high film strength.

Other useful water-soluble linear organic polymers include polyvinyl pyrrolidone and polyethyleneoxide. For the purpose of raising the strength of a cured film, on the other hand, alcohol-soluble nylon and the polyether of 2,2-bis(4-hydroxyphenyl)propane and epichlorohydrin are well suited. These linear organic high polymers can be mixed in any amount in the total composition. So far as the image strength is concerned, however, desirable result cannot be brought about by mixing them in a proportion higher than 90 weight %. When the proportion is from 30 to 85 weight %, desirable results can be produced. In addition, it is desirable that the ratio between the photopolymerizable ethylenic unsaturated double bond-containing compounds and the linear organic high polymers be from 1/9 to 7/3 by weight. In preferred embodiments, the binder polymers used are high polymers insoluble in water in a substantial sense but soluble in alkali. By the use of such high polymers, the developer can avoid being constituted of organic solvents undesirable from the environmental point of view, or the proportion of organic solvents therein can be drastically limited. In adopting such a way of using binder polymers, the acid value (the acid content per g of polymer, expressed in chemical equivalent number) and the molecular weight of the binder polymer used are selected properly from the viewpoints of image strength and developability. Specifically, the suitable acid value is from 0.4 to 3.0 meq/g, preferably from 0.6 to 2.0 meq/g, and the suitable molecular weight is from 3,000 to 500,000, prefeably from 10,000 to 300,000.

Co-sensitizer

The sensitivity of the present photosensitive composition can be further increased by using certain additives (hereinafter referred to as co-sensitizers). The mechanism of such sensitization, though not clear, can be supposed to be based on the following chemical processes in many cases. More specifically, it is supposed that new active radicals are produced by reacting the co-sensitizers with various intermediate active species (radicals, peroxides, oxidants, reductants) produced during the process of photo-reaction initiated by light absorption of the foregoing photo-initiation system and the addition polymerizing reaction subsequent thereto. These co-sensitizers can be roughly classified into (a) compounds producing active radicals by reduction, (b) compounds producing active radicals by oxidation, and (c) compounds reacting with radicals having low activity to be converted into radicals having higher activity, or to act as chain transfer agent. In many cases, however, there is no common view as to which category each co-sensitizer belongs to.

(a) Compounds Producing Active Radicals by Undergoing Reduction

Compounds having carbon-halogen bonds: Active radicals are supposed to be produced by reductive cleavage of a carbon-halogen bond. For example, trihalomethyl-s-triazines and trihalomethyloxadiazoles can be used appropriately.

Compounds having nitrogen-nitrogen bonds: Active radicals are supposed to be produced by reductive cleavage of a nitrogen-nitrogen bond. For example, hexaarylbiimidazoles can be used appropriately.

Compounds having oxygen-oxygen bonds: Active radicals are supposed to be produced by reductive cleavage of oxygen-oxygen bond(s). For example, organic peroxides can be used appropriately.

Onium compounds: Active radicals are supposed to be produced by reductive cleavage of a carbon-hetero atom bond or oxygen-nitrogen bond. For example, diaryliodonium salts, triarylsulfonium salts and N-alkoxypyridinium (azinium) salts can be used appropriately.

Ferrocenes and Iron-arene complexes: Active radicals can be produced reductively.

(b) Compounds Producing Active Radicals by Undergoing Oxidation

Alkyl-ato complexes: Active radicals are supposed to be produced by oxidative cleavage of a carbon-hetero atom bond. For example, triarylalkylborates can be used appropriately.

Alkylamine compounds: Active radicals are supposed to be produced by oxidative cleavage of a C—X bond on the carbon adjacent to the nitrogen. Suitable examples of X include a hydrogen atom, a carboxyl group, a trimethylsilyl group and a benzyl group. And suitable examples of such compounds include ethanolamines, N-phenylglycines and N-trimethylsilylmethyl-anilines.

Sulfur or tin-containing compounds: The compounds containing sulfur or tin atoms in place of the nitrogen atoms in the alkylamine compounds recited above can produce active radicals by the similar action. In addition, the compounds having S—S bonds are also known to have sensitizing effect through the S—S bond cleavage.

α-Substituted methylcarbonyl compounds: Active radicals can be produced by oxidative cleavage of the bond between carbonyl and α-carbon. In addition, the compounds obtained by converting the foregoing carbonyl groups into oxime ethers have the similar action, too. Examples of such compounds include 2-alkyl-1-[4-(alkylthio)phenyl]-2- morpholinopropanones-1 and the oxime ethers prepared by reacting these compounds with hydroxy amines and then etherifying the N—OH therein.

Sulfinic acid salts: These salts can produce active radicals by undergoing oxidation, with examples including sodium arylsulfinates.

(c) Compounds Reacting with Radicals to be Converted into Highly Active Radicals, or to Act as Chain Transfer Agents For example, the compounds having SH, PH, SiH or GeH in each molecule can be used. These compounds can produce radicals by donating their hydrogen atoms to low active radicals, or by undergoing oxidation and subsequent proton removal. Examples of such compounds include 2-mercaptobenzimidazoles.

More specific examples of co-sensitizers as described above can be found, e.g., in JP-A-9-236913. Therein, many compounds are disclosed as the additives aimed at the sensitivity increase. A part of those compounds are illustrated below, but they should not be construed as limiting the scope of the invention in any way:

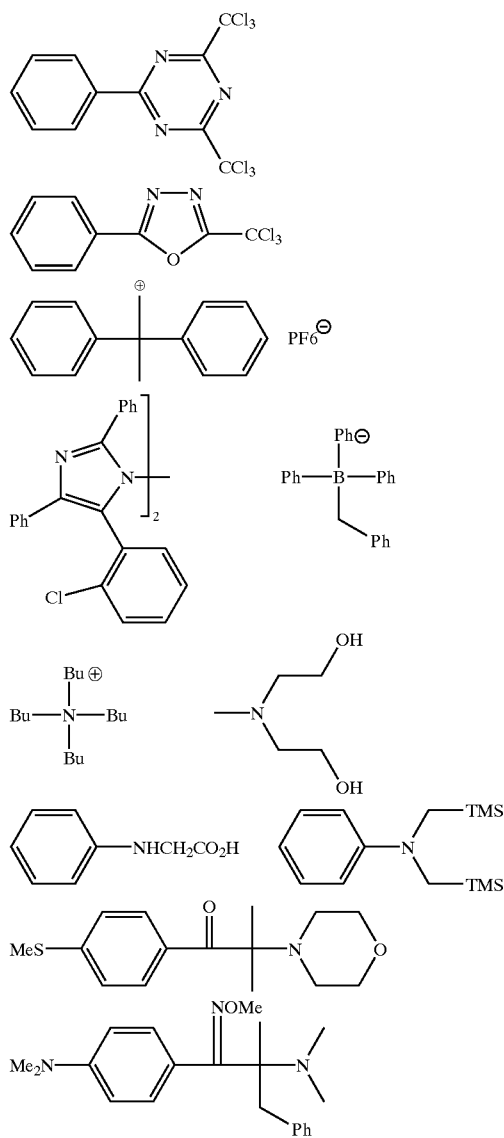

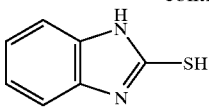

When the present photosensitive composition is used for the photosensitive layer of a lithographic printing plate precursor, in analogy with the sensitizing dyes as mentioned above, it is possible to introduce various chemical modifications to those co-sensitizers also for the purpose of improving characteristics of the photosensitive layer. For instance, such chemical modifications can be made to co-sensitizers by adopting a method of linking thereto a sensitizing dye part, an activator part or an addition polymerizable unsaturated compound part, a method of introducing thereinto a hydrophilic moiety, a substituent group for increasing the compatibility or controlling the deposition of crystals, or a substituent group for raising the adhesion, or a method of converting them into polymers.

The co-sensitizers as recited above can be used alone or as a combination of two or more thereof. The suitable amount of co-sensitizers used is from 0.05 to 100 parts by weight, preferably from 1 to 80 parts by weight, particularly preferably from 3 to 50 parts by weight, per 100 parts by weight of compound having at least one ethylenically unsaturated double bond.

Polymerization Inhibitor

For the purpose of preventing unnecessary thermal polymerization of the compound having at least one polymerizable ethylenic unsaturated double bond during the process of producing or storing the present photosensitive composition, it is desirable to add a small amount of thermal polymerization inhibitor. Examples of a thermal polymerization inhibitor suitable for the foregoing purpose include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and N-nitrosophenylhydroxyamine cerous salt. The suitable proportion of thermal polymerization inhibitors added is from about 0.01 to about 5% by weight to the total composition. If it is needed to prevent the hindrance to polymerization by oxygen when the present photosensitive composition is used for the photosensitive layer of a lithographic printing plate precursor, higher fatty acids or derivatives thereof, such as behenic acid or behenic acid amide, may be added to the photosensitive composition and localized on the surface of the photosensitive layer during the drying process after coating the photosensitive layer. The suitable addition amount of higher fatty acids or derivatives thereof is from about 0.5 to about 10% by weight to the total composition.

Coloring Agent

When the present photosensitive composition is used for the photosensitive layer of a lithographic printing plate precursor, dyes or pigments may further be added thereto for the purpose of coloring the photosensitive layer. By coloring the photosensitive layer, the plate precursor can provide improved visibility when made into the plate, and the so-called inspectability of the plate, such as suitability for image density measuring apparatus, can be enhanced. Since many of dyes causes a sensitivity drop in the photosensitive layer of photopolymerizable type, pigments are preferred in particular as coloring agent. Examples of a usable coloring agent include pigments, such as phthalocyanine pigments, azo pigments, carbon black and titanium oxide, and dyes, such as Ethyl Violet, Crystal Violet, azo dyes, anthraquinone dyes and cyanine dyes. The suitable proportion of dyes and pigments added is about 0.5 to about 5% by weight to the total composition.

Other Additive

When the present photosensitive composition is used for the photosensitive layer of a lithographic printing plate precursor, known additives, such as inorganic fillers and plasticizers for improving the physical properties of the photosensitive layer as a cured film, and sensitizers for improving the ink receptivity of the photosensitive layer surface, can further be added thereto.

Examples of a plasticizer usable for such a purpose include dioctyl phthalate, didodecyl phthalate, triethylene glycol dicaprylate, dimethyl glycol phthalate, tricresyl phosphate, dioctyl adipate, dibutyl sebacate and triacetyl glycerin. In the case of using a binder, such plasticizers can be added in a proportion of at most 10% by weight to the combination of the binder and the compound having at least one ethylenically unsaturated double bond.

Furthermore, in using the present photosensitive composition for the photosensitive layer of a lithographic printing plate precursor, it is also possible to add UV initiators and thermal cross-linking agents for intensifying the heating and exposing effects after development to increase the film strength (press life) of the photosensitive layer.

In addition, in using the present photosensitive composition for the photosensitive layer of a lithographic printing plate precursor, it is also possible to add thereto additives for enhancing the adhesiveness of the photosensitive layer to the support and the removablity of the unexposed area of the photosensitive layer, and to provide an interlayer between the photosensitive layer and the support. For instance, compounds having comparatively strong adhesiveness to the substrate, such as a compound having the diazonium structure and a phosphono compound, can be added or formed into an undercoat, thereby improving the adhesiveness and extending press life. On the other hand, the addition or the undercoat of a hydrophilic polymer, such as polyacrylic acid or polysulfonic acid, makes it possible to heighten the developability in the non-image area and to prevent scumming from developing.

In coating the present photosensitive composition on a support as described hereinafter to form the photosensitive layer of a lithographic printing plate precursor, the composition is in advance dissolved in any of various organic solvents. Examples of an organic solvent usable therein include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycolmonoethyl ether, acetyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. These solvents can be used alone or as a mixture of two or more thereof. The suitable solids concentration in the coating composition is from 2 to 50% by weight.

The coverage of the photosensitive layer on the support can affect chiefly the sensitivity and the developability of the photosensitive layer, and the film strength, or the press life, of the exposed photosensitive layer, so that it is desirable that the coverage be chosen properly depending on the use intended. When the coverage is too scant, the adequate press life cannot be achieved; while, when it is too heavy, the sensitivity is lowered to require a long time for exposure, and besides, the time taken to perform development-processing becomes long. For the application of the present photosensitive composition to the production of a lithographic printing plate via scanning exposure, which is mainly aimed at by the invention, the suitable coverage of the photosensitive layer after drying is from about 0.1 $g/m^2$ to about 10 $g/m^2$, preferably from 0.5 $g/m^2$ to 5 $g/m^2$.

For the formation of a lithographic printing plate precursor using the present photosensitive composition, which is one of the main objects of the invention, it is desirable that the photosensitive layer be provided on a support having a hydrophilic surface. As such a support, conventional hydrophilic supports known to be applicable to lithographic printing plates can be employed without any restrictions. The support suitably used herein is a dimensionally stable sheet-form material, with examples including paper, paper laminated with plastic (such as polyethylene, polypropylene, or polystyrene), a metal sheet (such as a sheet of aluminum, zinc, or copper), a plastic film (such as a film of cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, or polyvinyl acetal) and paper or a plastic film on which the metal as recited above is laminated or deposited. The surface of these supports each may be subjected to known physical and chemical treatments appropriate for conferring water wettability thereon and raising the strength thereof, if needed.

The supports suitable in particular are paper, polyester film and aluminum sheet. Of these materials, the aluminum sheet is preferred over the others, because it has satisfactory dimensional stability, can get at a comparatively low price, and can provide highly hydrophilic and strong surface by adequate surface treatments. In addition, the composite sheet as disclosed in JP-B-48-18327, wherein an aluminum sheet is united with a polyethylene terephthalate film, is also used to advantage.

The suitable aluminum sheets include a pure aluminum sheet and alloy sheets containing aluminum as a main component and very small amounts of foreign elements. Further, aluminum-laminated or deposited plastic films may be included therein. Examples of foreign elements contained in aluminum alloys include silicon, iron, manganese, copper, magnesium, chromium, zinc, bismuth, nickel, and titanium. The proportion of foreign elements in the alloy is at most 10% by weight. Although the pure aluminum sheet is most desirable for applying the present composition thereto, the production of perfectly pure aluminum is difficult in view of the present smelting techniques. Such a being case, the aluminum sheet may contain trace amounts of foreign elements. Thus, the aluminum sheet to which the present photosensitive composition is applied has no particular restriction as to the composition, but hitherto known conventional aluminum sheets can be used. The suitable thickness of the aluminum sheet to which the present photosensitive composition is applied is from about 0.1 mm to about 0.6 mm, preferably from 0.15 mm to 0.4 mm, particularly preferably from 0.2 mm to 0.3 mm.

When the support has a metal surface, especially an aluminum surface, it is desirable for the support to undergo a surface treatment, such as a surface roughening (graining) treatment, an immersion treatment in an aqueous solution of sodium silicate, potassium fluorozirconate or phosphoric acid salts, or an anodic oxidation treatment.

The surface roughening treatment for aluminum sheets can be carried out using various methods, such as the method of mechanically roughening the aluminum sheet surface, the method of roughening the aluminum sheet surface by electrochemical dissolution, and the method of chemically performing selective dissolution of the aluminum sheet surface. As to the mechanical method, known methods including a ball abrasion method, a brush abrasion method, a blast abrasion method and a buff abrasion method can be adopted. As to the electrochemical method for surface roughening, the method of performing AC or DC electrolysis in an electrolyte, such as hydrochloric acid or nitric acid, is usable. Also, as disclosed in JP-A-54-63902, the combination of both methods recited above can be utilized. In addition, prior to the surface roughening treatment for aluminum sheets, the aluminum sheet surface may undergo degreasing treatment with, e.g., a surfactant, an organic solvent or an alkaline aqueous solution in order to remove the rolling oil from the sheet surface, if desired.

Further, the aluminum sheet that has undergone immersion treatment in an aqueous solution of sodium silicate after its surface was roughened is used to advantage. In addition, the aluminum sheet that has undergone anodic oxidation treatment and then an immersion treatment in an aqueous solution of alkali metal silicate, as disclosed in JP-B-47-5125, is also favorable. The anodic oxidation treatment can be effected by sinking an aluminum sheet as anode into an electrolyte and passing current therethrough. As the electrolyte therein, aqueous or non-aqueous solutions of inorganic acids, such as phosphoric acid, chromic acid, sulfuric acid and boric acid, organic acids, such as oxalic acid and sulfaminic acid, or salts thereof can be used alone or as combination of two or more thereof.

In addition, as disclosed in U.S. Pat. No. 3,658,662, it is also effective to carry out the electrodeposition of silicate.

As disclosed in JP-B-46-27481, JP-A-52-58602 and JP-A-52-30503, it is also effective that the support that has undergone electrolytic graining is further subjected to a surface treatment as the combination of the foregoing anodic oxidation and sodium silicate treatments.

In addition, as disclosed in JP-A-56-28893, it is also desirable to use the support subjected successively to mechanical surface roughening, chemical etching, electrolytic graining, anodic oxidation and treatment with sodium silicate.

After performing the treatments as mentioned above, it is desirable that the support be provided with undercoating of a water-soluble resin, such as polyvinylphosphonic acid, a homo- or copolymer having sulfonic acid groups in its side chains or polyacrylic acid, a water-soluble metallic salt (e.g., zinc borate), a yellow dye or an amine salt.

Furthermore, the substrate having undergone the sol-gel treatment as disclosed in JP-A-7-159983, to which functional groups capable of radically causing addition reaction are bonded covalently, can also be used to advantage.

As still another example of a suitable support, mention may be made of a support on which a waterproof hydrophilic layer is provided as its surface layer. Examples of such a surface layer include the layer constituted of an inorganic pigment and a binder as disclosed in U.S. Pat. No. 3,055,295 or JP-A-56-13168, the hydrophilic swelling layer disclosed in JP-A-9-80744, and the sol-gel film constituted of titanium oxide, polyvinyl alcohol and silicic acids as disclosed in JP-W-8-507727 (wherein the term "JP-W" as used herein means an "international patent application published in its Japanese national proceeding").

Besides making the support surface hydrophilic, those water-receptivity imparting treatments are performed for prevention of a harmful reaction in the photosensitive composition applied to the support surface and elevation of adhesiveness to the photosensitive layer.

Protective Layer

With respect to the lithographic printing plate precursor designed for scanning exposure, which is a desirable mode of the present photosensitive composition, the exposure is generally carried out in the atmosphere, and so it is desirable to further provide a protective layer on the layer of the photosensitive composition. The protective layer is provided for the purpose of preventing low molecular substances in the atmosphere, such as oxygen and basic substances, from invading into the photosensitive layer to avoid the inhibitory effect of such invaded substances upon the image forming reaction caused in the photosensitive layer by exposure, thereby enabling the exposure in the atmosphere. Therefore, the characteristics required for such a protective layer are its high permeability barrier to low molecular substances, including oxygen, substantially no interference thereby in the transmission of exposure light, excellent adhesion to the photosensitive layer and easy removal thereof during the development processing subsequent to the exposure step. Various devices for meeting such requirements for the protective layer have so far been proposed. The detailed description thereof can be found in U.S. Pat. No. 4,458,311 and JP-A-55-49729.

The materials useful for the protective layer are, e.g., water-soluble high molecular compounds having comparatively high crystallinity. As examples thereof, water-soluble polymers, such as polyvinyl alcohol, polyvinyl pyrrolidone, acidic celluloses, gelatin, gum arabic and polyacrylic acid, are known. Viewed in the light of basic characteristics, such as oxygen imperviousness and easy removal by development, however, the use of polyvinyl alcohol as the main component for the protective layer can bring about best results. In using polyvinyl alcohol as the main component of the protective layer, partially esterified, etherified or acetylated polyvinyl alcohol may be employed instead of unmodified polyvinyl alcohol so far as the unmodified vinyl alcohol units contained therein are enough for providing necessary oxygen imperviousness and solubility in water. In analogy with modification, copolymerizing units may be contained as a part of polyvinyl alcohol. Specifically, it is desirable to use polyvinyl alcohol undergoing hydrolysis in a proportion of 71 to 100% and having its molecular weight in the range of 300 to 2,400. Examples of such polyvinyl alcohol include the products of Kuraray Co., Ltd. the trade names of which are PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8.

The components (species of PVA and additives) and the coverage of the protective layer are selected taking consideration of fogging tendency, adhesiveness and scratching resistance in addition to oxygen imperviousness and easiness of removal by development. In general, the higher the hydrolysis rate of the PVA used (the proportion of unmodified vinyl alcohol units in the protective layer) and the greater the thickness of the protective layer, the better the oxygen imperviousness, and so such situations have an advantage in sensitivity. However, too high oxygen imperviousness causes problems that unnecessary polymerization reactions occur during the production of the plate precursor or the storage thereof before platemaking operations and undesirable fogging and thickening phenomena occur at the time of image exposure. Also, the adhesiveness of the protective layer to image areas and its scratching resistance are very important in handling the plate. More specifically, when the hydrophilic layer made up of a water-soluble polymer is laminated on an oleophilic (ink-receptive) polymerizing composition layer, it is liable to be delaminated because of its poor adhesion and, in the delaminated area, the polymerization is inhibited by oxygen to cause defects, including curing shortage. Such being the case, various proposals for improving the adhesion between these two layers have been made. For instance, U.S. Pat. Nos. 292,501 and 44,563 describe that sufficient adhesion is achieved by laminating on an oleophilic polymerizing composition layer a hydrophilic layer containing 20 to 60 weight % of acrylic emulsion or water-insoluble copolymer of vinyl pyrrolidone in addition to hydrophilic polymers including polyvinyl alcohol. Any of those known arts can be applied to the protective layer of the lithographic printing plate precursor in which the present photosensitive composition is used. The coating methods applicable to the protective layer as mentioned above are described in detail in U.S. Pat. No. 3,458, 311 and JP-A-55-49729.

Further, other functions can be conferred on the protective layer. For instance, when the coloring agent (water-soluble dyes) showing high transmittance with respect to exposure light of wavelengths from 350 nm to 450 nm, and besides, capable of efficiently absorbing light of wavelengths of no shorter than 500 nm is added to a protective layer, the resultant protective layer can have further enhanced darkroom safelight suitability without attended by a drop in sensitivity.

When the photosensitive material using the present photosensitive composition is employed as an image forming material, the photosensitive material is subjected to image-wise exposure, and then the unexposed area thereof is removed with a developer to effect the image formation. Examples of a developer suitable for the case where the composition of the present invention is used for the preparation of a lithographic printing plate precursor include the developers disclosed in JP-B-57-7427, namely water solutions of inorganic alkali agents, such as sodium silicate, potassium silicate, sodium hydroxide, potassium hydroxide, lithium hydroxide, tertiary sodium phosphate, secondary sodium phosphate, tertiary ammonium phosphate, secondary ammonium phosphate, sodium metasilicate, sodium hydrogen carbonate and ammonia, and water solutions of organic alkali agents, such as ethanolamine and diethanolamine. These alkali agents are added to water so that the resulting alkaline solution has a concentration of 0.1 to 10 weight %, preferably 0.5 to 5 weight %.

These alkaline aqueous solutions can further contain small amounts of a surfactant and an organic solvent, such as benzyl alcohol, 2-phenoxyethanol or 2-butoxyethanol, if desired. For details of such developers the descriptions in U.S. Pat. Nos. 3,375,171 and 3,615,480 can be referred to. In addition, the developers disclosed in JP-A-50-26601, JP-A-58-54341, JP-B-56-39464 and JP-B-56-42860 are also used to advantage.

In the process of making a lithographic printing plate from the lithographic printing plate precursor in which the present photosensitive composition is comprised, the whole surface of the plate precursor may be heated before exposure, during exposure and during a period from exposure to development, if needed. By these heating treatments, the image forming reaction in the photosensitive layer can be promoted to bring about the advantages of increasing the sensitivity, extending a press life and stabilizing the sensitivity. Further, it is effective for improvements of image strength and press life that the developed image is subjected to overall after-heating or overall exposure. In general, it is desirable to carry out the heating prior to development under a mild condition of 150° C. or below. The heating at a too high temperature causes a trouble that the fogging extends to the non-image area. On the other hand, the heating after development is carried out under a severe condition. In general, the heating temperature is selected from the range of 200 to 500° C. The heating at a too low temperature cannot produce sufficient image strengthening effect, while the heating at a too high temperature causes deterioration of the support and pyrolysis in the image area.

Moreover, it is possible to adopt particularly excellent development-processing method in the CPT system performing exposure and development operations based on digitized image information, the application to which is mainly aimed at by the present photosensitive composition. More specifically, on the basis of previously digitized image information, instructions concerning the optimum development-processing conditions reflecting the image information are entered into the control unit of a plate material processing apparatus, such as an automatic processor, and thereby it becomes possible to carry out the processing while properly selecting the most suitable development-conditions (amount of developer replenished, development temperature, development time, after-heating time, finisher condition, after-exposure condition). Thus, the processing stability can be enhanced to a great extent and the printing performance can be maintained constant. For instance, Japanese Patent Application No. 11-15144 discloses the method in which the area information A (m$^2$) concerning the non-image part and the plate species information X are memorized in the control unit of an automatic processor and the developer is replenished in the amount determined by the following definition dependent on the memorized information, thereby greatly increasing the total area of plate materials processed while minimizing the volume of a developer used:

Area-based replenisher volume (ml) in an automatic processor= Area-based replenishment rate Rx (ml/m$^2$)×Area A (m$^2$)

wherein Rx is a replenisher volume (ml) required for developing 1 m$^2$ of a plate species X having no image in its entirety.

For the exposure of the lithographic printing plate precursor designed for scanning exposure, wherein the present photosensitive composition is utilized, known methods can be employed without any restriction. However, it is advantageous to use a light source the wavelengths of which are in the range of 350 nm to 450 nm, specifically InGaN semiconductor laser devices. The exposure mechanism may be any of an inside drum system, an outside drum system and a flatbed system. on the other hand, since the photosensitive layer comprising the present photosensitive composition can be made soluble in neutral water or faintly alkaline water by using highly water-soluble ingredients therein, the lithographic printing plate precursor having such a constitution can also be processed using a system that the plate precursor is loaded on a printing press and subjected sequentially to exposure and development as it is loaded thereon.

As to the commercially available sources of laser beams having wavelengths in the range of 350 to 450 nm, the following devices can be utilized:

Examples of a gas laser device usable as the foregoing light source include Ar ion laser (354 nm, 351 nm, 10 mW to 1 W), Kr ion laser (356 nm, 351 nm, 10 mW to 1 W) and He—Cd laser (441 nm, 325 nm, 1 mW to 100 mW).

Examples of a solid laser device usable as the foregoing light source include Nd: YAG(YVO$_4$) combined twice with an SHG crystal (355 nm, 5 mW to 1 W), and Cr:LiSAF combined with an SHG crystal (430 nm, 10 mW).

Examples of a semiconductor laser device usable as the foregoing light source include a KNbO$_3$ ring resonator (430 nm, 30 mW), the combination of a waveguide-type wavelength changing element with AlGaAs and InGaAs semiconductors (380 to 450 nm, 5 mW to 100 mW), the combination of a waveguide-type wavelength changing element with AlGaInP and AlGaAs semiconductors (300 to 350 nm, 5 mW to 100 mW), and AlGaInN (350 to 450 rm, 5 mW to 30 mW).

Examples of a pulse laser device usable as the foregoing light source include N$_2$ laser (337 nm, 0.1 to 10 mJ pulse), and XeF (351 nm, 10 to 250 mJ pulse).

Of these laser devices, AlGaInN semiconductor laser (commercially available semiconductor laser of InGaN type, 400 to 410 nm, 5 to 30 mW) is advantageous over the others from the viewpoints of wavelength characteristics and cost.

In the exposure apparatus used for making a lithographic printing plate from the plate precursor having a scanning exposure suitability, any of inside drum, outside drum and flatbed systems can be adopted as the exposure mechanism, and any of the laser devices recited above, except pulse laser devices, can be used as the light source. In actually, the exposure apparatus as described below is used to advantage in respect to the relation between the sensitivity and the platemaking time of the plate precursor.

Specifically, the single beam exposure apparatus using an inside drum system and one gas laser or solid laser light source, the multi-beam exposure apparatus using a flatbed system and a number of (at least 10) semiconductor laser devices, and the multi-beam exposure apparatus using an outside drum system and a number of (at least 10) semiconductor laser devices are suitable for scanning exposure.

When the lithographic printing plate is made by direct drawing with laser beams, the following equation (eq1) is generally set up between the plate precursor sensitivity X (J/cm$^2$), the exposed area S (cm$^2$) of the plate precursor, the power q (W) of one laser light source, the number n of laser beams and the total exposure time t (sec):

$$X \cdot S = n \cdot q \cdot t \quad \text{(eq1)}$$

i) Inside Drum-Single Beam System

The following equation (eq2) is set up between the number of laser beam revolutions (radian/sec), the sub-scan length Lx (cm) on the plate precursor, resolution Z (dots/cm) and the total exposure time t (sec);

$$f \cdot Z \cdot t = Lx \quad \text{(eq2)}$$

ii) Outside Drum-Multi-beam System

The following equation (eq3) is set up between the number of drum revolutions F (radian/sec), the sub-scan length on the plate precursor Lx (cm), resolution Z (dots/cm), the total exposure time t (sec) and the number of beams n;

$$F \cdot Z \cdot n \cdot t = Lx \quad \text{(eq3)}$$

iii) Flatbed-Multi-beam System

The following equation (eq4) is set up between the number of polygon mirror revolutions H (radian/sec), the sub-scan length on the plate precursor Lx (cm), resolution Z (dots/cm), the total exposure time t (sec) and the number of beams n;

$$F \cdot Z \cdot n \cdot t = Lx \quad \text{(eq4)}$$

By substituting the resolution required for practical printing plates (2560 dpi), the plate size (A1/B1, sub-scan length 42 inch), the exposure condition of 20 sheets/hour and the sensitivity characteristics of the present photosensitive composition (sensitivity at the wavelengths of light to which the composition has sensitivity: about 0.1 mJ/cm$^2$) into the foregoing equations, it can be understood that the combination of the present plate precursor and the exposure to multi-beams from a semiconductor laser device is preferable. Further considering operability and cost, it is most desirable to combine the present plate precursor with the semiconductor multi-beam exposure apparatus wherein an outside drum system is adopted.

Other light sources usable for exposure of the present photosensitive composition include ultrahigh-, high-, medium- and low-pressure mercury lamps, a chemical lamp, a carbon arc lamp, a xenon lamp, a metal halide lamp, various kinds of visible and UV laser lamps, a fluorescent lamp, a tungsten lamp and sun light.

In addition to the use for the lithographic printing plate precursor having scanning exposure suitability, the present photocomposition can be applied to all things known to be the uses of photosetting resins. For instance, the application to a liquid photosensitive composition, if needed, combined with a cation polymerizable compound can provide a highly sensitive photo-molding material. Further, the present photosensitive composition can be made into a hologram material by utilizing a change in refractive index caused by photopolymerization. Furthermore, the present photosensitive composition can also be applied to various transfer materials (photosensitive release materials, photosensitive materials for toner development) by utilizing a change in surface tackiness caused by photopolymerization. In addition, the present composition is also applicable to not only the photo setting of microcapsules, but also the preparation of electronic materials, such as photoresist, and photosetting resin materials, such as ink, paint and adhesive.

The present invention will be illustrated in greater detail by reference to the following examples. However, the invention should not be construed as being limited to these examples.

Reference Experiments

The emission intensity distributions of generally used darkroom lamps were measured; and the position at which the emission intensity rose at the short wavelength side of the distribution was determined. Further, the workability under each of the darkroom lamps was evaluated. The results of these experiments are shown below:

| Darkroom lamp | Short wavelength end of emission | Workability |
| --- | --- | --- |
| White lamp | 400 nm | good |
| Yellow lamp | 520 nm | bright enough for platemaking work |
| Orange lamp | 570 nm | difficult to work, and it takes some time to adapt to working |
| Red lamp | 600 nm | very dusky, so the work requires skill |

Preparation of Pigment Dispersion

The mixtures having the compositions shown in Table 1 were each dispersed for one hour at 45° C. using a Dyno mill dispersing machine at 3000 r.p.m. The thus obtained dispersions were examined for their respective grain sizes by means of a laser scattering-utilized microtrack UPA granulometer (made by Nikkiso K.K.). Each dispersion was coated on a glass substrate so as to have a coating amount of $0.2 g/m^2$, and the transmittances thereof at 500 nm and 400 nm were compared with a spectrophotometer, UV-Visible Recording Spectrophotometer UV-260 (trade name, a product of Shimadzu Corporation). The results of these measurements are also shown in Table 1.

TABLE 1

| Pigment dispersion | Pigment (g) | Polymer as dispersion medium (g) | Solvent (g) | Average grain size ($\mu$m) | Transmittance comparison |
| --- | --- | --- | --- | --- | --- |
| PD1 | P-25 (30) | allylmethacrylate/methacrylic acid (83/17) copolymer weight average molecular weight: $10 \times 10^4$ (20) | cyclohexanone (35) methoxypropyl acetate (115) | 0.30 | 400 nm >500 nm |
| PD2 | P-18 (30) | allylmethacrylate/methacrylic acid (80/20) copolymer weight average molecular weight: $4 \times 10^4$ (20) | cyclohexanone (35) methoxypropyl acetate (115) | 0.13 | 400 nm >500 nm |
| PD3 | P-26 (30) | butylmethacrylate/methacrylic acid (80/20) copolymer weight average molecular weight: $15 \times 10^4$ (20) | cyclohexanone (35) methoxypropyl acetate (115) | 0.25 | 400 nm >500 nm |
| PD4 | P-27 (30) | ethylmethacrylate/methacrylic acid (80/20) copolymer weight average | cyclohexanone (35) methoxypropyl | 0.40 | 400 nm >500 nm |

TABLE 1-continued

| Pigment dispersion | Pigment (g) | Polymer as dispersion medium (g) | Solvent (g) | Average grain size ($\mu$m) | Transmittance comparison |
|---|---|---|---|---|---|
| | | molecular weight: $15 \times 10^4$ (20) | acetate (115) | | |
| PD5 (comparison) | copper phthalocyanine pigment I No. Pigment Blue 15:6 (30) | allylmethacrylate/methacrylic acid (83/17) copolymer weight average molecular weight: $10 \times 10^4$ (20) | cyclohexanone (35) methoxypropyl acetate (115) | 0.20 | 500 nm >400 nm |
| PD6 (comparison) | P-27 (30) | benzylmethacrylate/methacrylic acid (80/20) copolymer weight average molecular weight: $10 \times 10^4$ (20) | cyclohexanone (35) methoxypropyl acetate (115) | 0.90 | 500 nm >400 nm |

EXAMPLES 1 TO 4 And Comparative Examples 1 to 5
Production of Lithographic Printing Plate Precursors
(Preparation of Support)

A 0.30 mm-thick aluminum sheet was etched by 25-second dipping in a 10 weight % sodium hydroxide solution kept to 60° C., and then washed with running water, neutralized and cleaned with 20 weight % nitric acid, and further washed with water. Further, this aluminum sheet was immersed in 1 weight % aqueous nitric acid solution and subjected to electrolytic surface roughening treatment using sine-wave alternating waveform current under the anodic electricity of 300 coulomb/dm². Subsequently thereto, the aluminum sheet was dipped in 1 weight % aqueous sodium hydroxide solution for 5 seconds at 40° C., and then immersed in a 30 weight % aqueous sulfuric acid solution for 40 seconds at 60° C. to effect desmutting treatment. Further, the thus treated aluminum sheet underwent 2-minute anodic oxidation treatment in a 20 weight % aqueous sulfuric acid solution under the current density of 2 A/dm² to form an anodic oxidation film of 2.7 g/m² at the surface. The surface roughness of the thus treated aluminum sheet was found to be 0.3 $\mu$m (expressed in terms of Ra according to JIS B0601).

On the back of the thus treated aluminum sheet, the following sol-gel reaction solution was coated with a bar coater, and dried for 1 minute at 100° C. to form a support provided with a backing coat having a dry coating amount of 70 mg/m².

Sol-gel Reaction Solution

| | |
|---|---|
| Tetraethyl silicate | 50 parts by weight |
| Water | 20 parts by weight |
| Methanol | 15 parts by weight |
| Phosphoric acid | 0.005 parts by weight |

When the ingredients described above were mixed with stirring for about 5 minutes, the mixture began to generate heat. After the reaction continued for 60 minutes, the solution containing the following ingredients was added to the reaction mixture, thereby preparing a backing coat solution.

| | |
|---|---|
| Pyrogallol-formaldehyde condensed resin (molecular weight: 2,000) | 4 parts by weight |
| Dimethyl phthalate | 5 parts by weight |
| Fluorine-containing surfactant (N-butylperfluorooctanesulfonamidoethyl acrylate/polyoxyethylene acrylate copolymer, molecular weight: $2 \times 10^4$) | 0.7 parts by weight |
| Methanol silica sol (produced by Nissan Chemicals Industries Ltd., methanol concentration: 30 weight %) | 50 parts by weight |
| Methanol | 800 parts by weight |

(Preparation of Photosensitive Layer)

On the thus treated aluminum sheet, the photosensitive composition containing the following ingredients was coated so as to have a dry coating amount of from 1.0 to 2.0 g/m², and dried for 2 minutes at 80° C., thereby forming a photosensitive layer:

| | |
|---|---|
| Pentaerythritol tetraacrylate | 1.5 g |
| Benzyl methacrylatae/methacrylic acid (75/25 by mole) copolymer | 2.0 g |
| Photopolymerization initiator | (shown in Table 2) |
| Sensitizing dye | (content set forth in Table 2) |
| Titanocene compound | (content set forth in Table 2) |
| Fluorine-containing nonionic surfactant (F-177) | 0.03 g |
| N-Nitrosophenylhydroxylamine aluminum salt (thermopolymerization inhibitor) | 0.01 g |
| Pigment dispersion (shown in Table 2) | (content set forth in Table 2) |
| Methyl ethyl ketone | 20 g |
| Propylene glycol monomethyl ether | 20 g |

(Preparation of Protective Layer)

On this photosensitive layer, a 3 weight % aqueous solution of polyvinyl alcohol (saponification degree: 98 mole %, polymerization degree: 550) was coated so as to have a dry coating amount of 2 g/m$^2$, and then dried for 2 minutes at 100° C.

Evaluation of Sensitivity and Safelight Suitability

Each of the thus produced lithographic printing plate precursors was brought into close contact with a Fuji Stepguide made by Fuji Photo Film Co., Ltd. (a gray scale having a series of transmission optical densities changed discontinuously by 0.15 as ΔD), and exposed to a xenon lamp via an optical filter so that the fixed exposure energy was applied thereto. Then, each plate precursor was developed by 10-second immersion in a 25° C. developer having the composition described below. The maximum of step numbers corresponding to the complete removal of images was read, and thereby the quantity of energy exposed was determined and the sensitivity (unit: mJ/cm$^2$) was calculated therefrom. The smaller the energy quantity thus determined, the higher the sensitivity of the plate precursor. For the purpose of estimating the exposure suitability for short wavelength semiconductor laser, the exposure to 400 nm monochromic light through an optical filter, Kenko BP-40, was also carried out. Further, the imagewise exposure-free plate precursor was exposed to a yellow lamp under an illumination of 200 lux over a period of 1 hour, and then developed in the same manner as mentioned above. When the thus developed plate precursor had a film residue, the fogging characteristic was regarded no good (NG). Furthermore, the absorbance of each plate precursor at 500 nm was determined in accordance with a diffuse reflection measuring method, wherein a spectrophotometer (UV-Visible Recording Spectrophotometer UV-260, made by Shimadzu Corporation) was used.

Composition of Developer

| | |
|---|---|
| DP-4 (made by Fuji Photo Film Co., Ltd.) | 65.0 g |
| Water | 880.0 g |
| Libomine LA (20% aqueous soln., made by Lion Co. Ltd.) | 50.0 g |

Additionally, the sensitizing dyes D1 to D3 set forth in Table 2 are those illustrated in the Detailed Description section of this specification, the pigment dispersions are those set forth in the foregoing Table 1, and the structures of the titanocene compounds used herein are illustrated hereinafter.

As can be seen from the results of Examples 1 to 4, the lithographic printing plate precursors comprising the present photosensitive compositions had excellent characteristics that their sensitivities to scanning exposure were sufficiently high and they generated no fog under a yellow lamp. On the other hand, as can be seen from the result of Comparative Example 1, the plate precursor free of the present pigment was inferior in fogging characteristic. And the plate precursors using the pigments whose optical characteristic was their smaller transmittance at 400 nm than at 500 nm had markedly low sensitivity (Comparative Examples 3 to 4) or insufficient improvement in fogging characteristic (Comparative Example 2).

EXAMPLES 5 TO 12 And Comparative Examples 6

Lithographic printing plate precursors were prepared and further converted into lithographic printing plates in accordance with the following procedures, and the printing properties of the thus made lithographic printing plates were evaluated. The results obtained are shown in Table 3.

Pretreatment of Support

The surface of a 0.30 mm-thick aluminum sheet (1S material) was grained using a nylon brush No. 8 and a 800-mesh pumice stone-water suspension, and then washed thoroughly with water. This sheet was etched by 60-second immersion in a 10 weight % aqueous solution of sodium hydroxide kept to 70° C., washed with running water, neutralized and cleaned with 20 weight % nitric acid, and further washed with water. Furthermore, the aluminum sheet was immersed in a 1 weight % aqueous solution of nitric

TABLE 2

| | Photoinitiation system | | | | | | Coating amount | | Sensitivity to | Fogging |
| | Sensitizing dye | | Titanocene compound | | Pigment dispersion | | of sensitive layer | Absorbance | 400 nm light | character- |
| Sample | species | amount (g) | species | amount (g) | species | amount (g) | (g/m$^2$) | at 500 nm | (mJ/cm$^2$) | istic |
|---|---|---|---|---|---|---|---|---|---|---|
| Example 1 | — | — | A-1 | 0.06 | PD1 | 2.0 | 1.5 | 0.15 | 1.0 | OK |
| Example 2 | D1 | 0.07 | A-2 | 0.03 | PD2 | 2.0 | 1.3 | 0.17 | 0.2 | OK |
| Example 3 | D2 | 0.07 | A-1 | 0.05 | PD3 | 2.5 | 2 | 0.2 | 0.2 | OK |
| Example 4 | D3 | 0.07 | A-2 | 0.08 | PD4 | 3.0 | 2 | 0.25 | 0.3 | OK |
| Comparative Example 1 | — | — | A-1 | 0.06 | — | — | 1.5 | <0.1 | 1.0 | NG |
| Comparative Example 2 | — | — | A-1 | 0.06 | PD5 | 2.0 | 1.5 | <0.1 | 5.0 | NG |
| Comparative Example 3 | — | — | A-1 | 0.06 | PD5 | 4.0 | 1.5 | 0.15 | 20 | OK |
| Comparative Example 4 | D1 | 0.07 | A-2 | 0.03 | PD5 | 4.0 | 1.3 | 0.13 | 15 | OK |
| Comparative Example 3 | D1 | 0.07 | A-2 | 0.03 | PD6 | 2.0 | 1.3 | 0.2 | 12 | OK | acid, and subjected to electrolytic surface roughening treatment using sine-wave alternating waveform current under the condition that $V_A$ was 12.7 V and the anodic electricity was 300 coulomb/dm$^2$. The surface roughness of the thus treated aluminum sheet was found to be 0.45 μm (expressed in terms of Ra according to JIS B0601).

Treatment for Imparting Hydrophilicity to Support Surface

The foregoing support was immersed in a 2.5 weight %, pH 11.2, 70° C. aqueous solution of sodium silicate No. 3 (SiO$_2$: 28–30%, Na$_2$O: 9–10%, Fe: less than 0.02%) for 13 seconds, and then washed with water. The silicate coverage on the support surface was calculated to be 10 mg/m$^2$ from the amount of Si element determined by the fluorescent X-ray analysis of the surface.

Formation of Interlayer

The coating Solution A having the following composition was prepared, and applied to the foregoing hydrophilic support surface so as to have a phenylphosphonic acid coating amount of 20 mg/M$^2$ by using whirler at 180 r.p.m., and then dried for 30 seconds at 80° C.

Coating Solution A for Interlayer

| | |
|---|---|
| Phenylphosphonic acid | 0.07–1.4 g |
| Methanol | 200 g |

Formation of Photosensitive Layer

The photosensitive solution having the following composition was prepared, and coated on the foregoing interlayer so as to have a coating amount of from 1.0 to 2.0 g/m$^2$ by means of a whirler, and dried for 1 minute at 100° C.

Photosensitive Solution

| | |
|---|---|
| Addition polymerizable compound (Compound as set forth in Table 3) | 1.5 g |
| Binder polymer (Compound as set forth in Table 3) | 2.0 g |
| Sensitizing dye (Compound as set forth in Table 3) | 0.1 g |
| Activator (Compound as set forth in Table 3) | 0.1 g |
| Cosensitizer (Compound as set forth in Table 3) | 0.3 g |
| Pigment dispersion (Compound as set forth in Table 3) | 2.0 g |
| Thermopolymerization inhibitor (N-nitrosophenylhydroxylamine aluminum salt) | 0.01 g |
| Surfactant (Megafac F-177, trade name, a product of Dai-Nippon Ink & Chemicals Inc.) | 0.02 g |
| Methyl ethyl ketone | 20.0 g |
| Propylene glycol monomethyl ether | 20.0 g |

Formation of Protective Layer

On the photosensitive layer, a 3 weight % aqeuous solution of polyvinyl alcohol (saponification degree: 98 moel %, polymerization degree: 550) was coated so as to have a dry coating amount of 2 g/m$^2$, and then dried for 2 minutes at 100° C.

Exposure of Lithographic Printing Plate Precursor

The thus prepared lithographic printing plate precursors were each exposed imagewise by using monochromatic light of 400 nm as a light source under a condition that the exposure powder was controlled so as to have the exposure energy density of 150 μJ/cm$^2$ at the plate surface. In the case of plate precursors having low sensitivity, the image areas are eluted in the development step, or the plates made therefrom cannot have a satisfactory long press life. For examining the fogging characteristic, on the other hand, the plate precursors were each exposed in advance to a yellow lamp of 400 lux for 30 minutes, and then subjected to the same image exposure as mentioned above. In the case of plate precursors having no good (NG) fogging characteristic, the scum develops on the non-image areas during the printing process after development.

Development/Platemaking

The prescribed developer (set forth in Table 3) and Finisher FP-2W made by Fuji Photo Film Co., Ltd. were laid in an automatic processor LP-850 made by Fuji Photo Film Co., Ltd., and each of the exposed plate precursors was made into a printing plate by the development using the automatic processor under a condition that the development temperature was 30° C. and the development time was 18 seconds. Thus, lithographic printing plate samples were obtained.

Press Life Examination

The printing press used was R201 made by Rohland Co., and the printing ink used was GEOS-G (N) produced by Dai-Nippon Ink & Chemicals, Inc. The solid image areas printed on sheets were observed as to whether or not they were uniform all over in density, and the number of printed sheets obtained before the solid image area failed to have uniform density all over was adopted as the standard for a press life. Therefore, the greater the number, the longer the press life.

Scumming Characteristic Examination

The printing press used was R201 made by Rohland Co., and the printing ink used was GEOS-G (N) produced by Dai-Nippon Ink & Chemicals, Inc. The non-image areas (unexposed areas) of printed sheets were observed for evaluation of scumming characteristic.

TABLE 3

| | Photosensitive Layer | | | | | | | | Printing properties | |
|---|---|---|---|---|---|---|---|---|---|---|
| | addition polymer-izable compound | binder polymer | sensitizing dye | activator | cosensitizer | pigment | coating amount (mg/m$^2$) | Developer composition | press life of image area | non-image area scumming characterisitic |
| Example 5 | M-1 | B-1 | D3 | A-2 | C-2 | P-1 | 1.5 | DV-1 | 100,000 | good |
| Example 6 | M-2 | B-1 | D4 | A-1 | C-2 | P-2 | 2 | DV-2 | 70,000 | good |
| Example 7 | M-2 | B-3 | D18 | A-2 | C-1 | P-3 | 1.8 | DV-3 | 200,000 | good |
| Example 8 | M-1 | B-2 | D11 | A-2 | C-1 | P-4 | 2.5 | DV-1 | 80,000 | good |
| Example 9 | M-1 | B-1 | D12 | A-1 | C-1 | P-1 | 1.5 | DV-1 | 100,000 | good |
| Example 10 | M-2 | B-3 | D19 | A-1 | C-1 | P-2 | 2 | DV-2 | 70,000 | good |
| Example 11 | M-2 | B-3 | D18 | A-2 | C-3 | P-3 | 2.5 | DV-3 | 50,000 | good |

TABLE 3-continued

| | Photosensitive Layer | | | | | | | Printing properties | |
|---|---|---|---|---|---|---|---|---|---|
| | addition polymerizable compound | binder polymer | sensitizing dye | activator | cosensitizer | pigment | coating amount (mg/m$^2$) | Developer composition | press life of image area | non-image area scumming characterisitic |
| Example 12 | M-2 | B-1 | D23 | A-1 | C-2 | P-4 | 1.8 | DV-1 | 80,000 | good |
| Comparative Example 6 | M-1 | B-1 | D3 | A-2 | C-2 | — | 1.5 | DV-1 | 100,000 | scumming developed all over |

Addition Polymerizable Compounds in Table 3
  M-1: Pentaerythritol tetraacrylate (NK ester A-TMMT, trade name, produced by Shin-Nakamura Kagaku Kogyo K.K.)
  M-2: Glycerin dimethacrylate hexamethylenediisoocyanate urethane prepolymer (UA101H, trade name, produced by Kyoei-sha Kagaku k.K.)
Binder Polymers in Table 3
  B-1: Allyl methacrylate/methacrylic acid/N-isopropylacrylamide copolymer (copolymerization ratio: 67/13/20 by mole)
    Acid value measured by NaOH titration: 1.15 meq/g
    Weight average molecular weight determined by GPC measurement: $13 \times 10^4$
  B-2: Allyl methacrylate/methacrylic acid copolymer (copolymerization ratio: 83/17 by mole)
    Acid value measured by NaOH titration: 1.55 meq/g
    Weight average molecular weight determined by GPC measurement: $12.5 \times 10^4$
  B-3: polyurethane resin as polycondensates of the following diisocyanates and diols;
    4,4'-diphenylmethanediisocyanate (MD1)
    hexamethylenediisocyanate (HMDI)
    Polypropylene glycol (weight average molecular weight: 1000) (PPG1000)
    2,2-bis(hydroxymethyl)propionic acid (DMPA)
    Copolymerization ratio by mole:
    MDI/HMDI/PPG1000/DMPA=40/10/15/35
    Acid value measured by NaOH titration: 1.05 meq/g
    Weight average molecular weight determined by GPC measurement: $4.5 \times 10^4$
Developers in Table 3
  DV-1: Aqueous solution having pH 10 and the following composition;

| | |
|---|---|
| Monoethanolamine | 0.1 parts by weight |
| Triethanolamine | 1.5 parts by weight |
| Compound of the following formula (1) | 4.0 parts by weight |
| Compound of the following formula (2) | 2.5 parts by weight |
| Compound of the following formula (3) | 0.2 parts by weight |
| Water | 91.7 parts by weight |

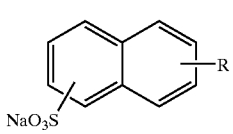
(1)

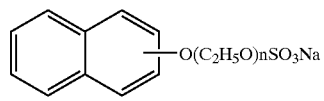
(2)

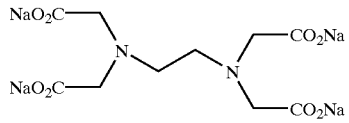
(3)

DV-2: Aqueous solution having pH 10 and the following composition;

| | |
|---|---|
| Sodium hydrogen carbonate | 1.2 parts by weight |
| Sodium carbonate | 0.8 parts by weight |
| Compound of the foregoing formula (1) | 3.0 parts by weight |
| Compound of the foregoing formula (2) | 2.0 parts by weight |
| Compound of the foregoing formula (3) | 0.2 parts by weight |
| Water | 92.8 parts by weight |

DV-3: Aqueous solution having pH 13 and the following composition;

| | |
|---|---|
| 1K potassium silicate | 3.0 parts by weight |
| Potassium hydroxide | 1.5 parts by weight |
| Compound of the foregoing formula (3) | 0.2 parts by weight |
| Water | 95.3 parts by weight |

Additionally, the symbols representing the sensitizing dyes and the pigments set forth in Table 3 are the same ones used respectively for representing those recited as their examples in the Detailed Description section of this specification. The structures of activators and cosensitizers set forth in Table 3 are illustrated below.

As can be seen from Table 3, the lithographic printing plate precursors using the present photosensitive compositions provided lithographic printing plates of high quality even when they were subjected to scanning exposure of very low energy, namely the exposure under the condition enabling the platemaking with high productivity. Further, these plate precursors had safelight suitability to enable the work under a yellow lamp.

Now, the structures of the titanocene compounds (activators) and the cosensitizers used in Examples and Comparative Examples are illustrated below:

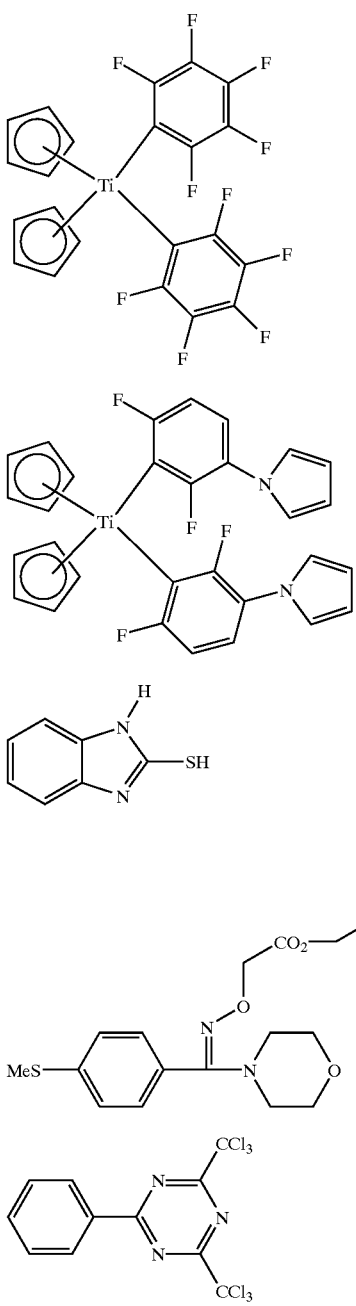

In accordance with this invention, the photosensitive composition comprises a titanocene compound and a pigment having an optical characteristic that the transmittance at 500 nm is relatively lower than the transmittance at 400 nm, and thereby the composition can have sufficiently high sensitivity to light of short wavelengths and no fog under a yellow lamp. In other words, the application of the present photosensitive composition to a photosensitive recording material enables the recording material to have sensitivity well suited for scanning exposure with a short-wavelength semiconductor laser device, such as InGaN, and handling suitability under a yellow lamp. In more detail, the invention can provide a lithographic printing plate precursor having suitability for scanning exposure and ensuring a long press life, good scumming characteristic and high stability for the printing plate.

While the present invention has been described in detail and with reference to specific examples thereof, it will be apparent to one skilled in the art that various changes and modifications can be made therein without departing from the spirit and scope thereof.

What is claimed is:

1. A photosensitive composition comprising:
   (i) at least one titanocene compound;
   (ii) an addition polymerizable compound containing at least one ethylenically unsaturated double bond; and
   (iii) at least one pigment having an optical characteristic such that the transmittance at 500 nm is relatively smaller than the transmittance at 400 nm.

2. The photosensitive composition according to claim 1, wherein said pigment is dispersed to have an average particle diameter of from 0.01 to 0.7 μm.

3. The photosensitive composition according to claim 2, wherein the average particle diameter of said dispersed pigment is from 0.01 to 0.4 μm.

4. The photosensitive composition according to claim 1, further comprising a sensitizing dye having a greater absorbance at 400 nm than an absorbance at 500 nm.

5. The photosensitive composition according to claim 4, wherein said sensitizing dye has a maximum sensitivity in a wavelength region longer than 300 nm and shorter than 430 nm.

6. The photosensitive composition according to claim 5, wherein said sensitizing dye is a merocyanine dye represented by formula (1):

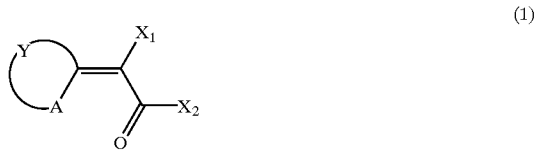

wherein A represents a sulfur atom or $NR_1$, $R_1$ represents a univalent nonmetal atomic group, Y represents a nonmetal atomic group forming a dye's basic nucleus in association with the adjacent A and the adjacent carbon atom, and $X_1$ and $X_2$ each represent a univalent nonmetal atomic group or they combine with each other to complete a dye's acidic nucleus.

7. The photosensitive composition according to claim 5, wherein said sensitizing dye is a styryl dye represented by formula (2):

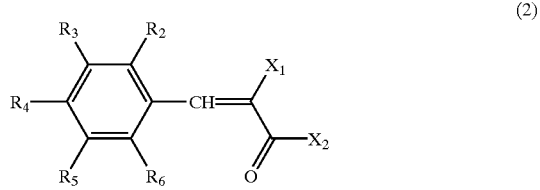

wherein $X_1$ and $X_2$ each represent a univalent nonmetal atomic group or they combine with each other to complete a dye's acidic nucleus and each of $R_2$ to $R_6$ represents a univalent nonmetal atomic group.

8. The photosensitive composition according to claim 5, wherein said sensitizing dye is a benzopyran or coumarin compound represented by formula (3):

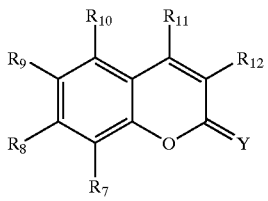

(3)

wherein =Y represents =O, =S, an imino group or an alkylidene group represented by the following formula (i), $X_1$ and $X_2$ each represent a univalent nonmetal atomic group or they combine with each other to complete a dye's acidic nucleus and each of $R_7$ to $R_{12}$ represents a univalent nonmetal atomic group

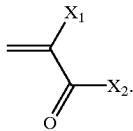

(i)

9. The photosensitive composition according to claim 5, wherein said sensitizing dye is an aromatic ketone compound represented by formula (4):

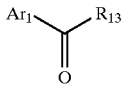

(4)

wherein $Ar_1$ represents an unsubstumed or substituted aryl or heteroaryl group, and $R_{13}$ represents a univalent nonmetal atomic group, or combines with $Ar_1$ to form a ring.

10. The photosensitive composition according to claim 5, wherein said sensitizing dye is an anthracene compound represented by formula (5):

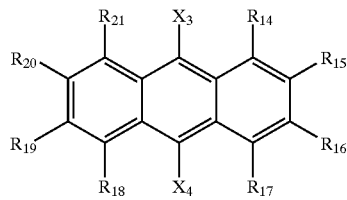

(5)

wherein $X_3$, $X_4$ and $R_{14}$ to $R_{21}$ each represent a univalent nonmetal atomic group.

11. The photosensitive composition according to claim 5, wherein said pigment is selected from the group consisting of azo pigments, perylene pigments, pyrazoloquinazolone pigments, aminoanthraquinone pigments, quinacridone pigments, acidic dye lake pigments and basic dye lake pigments.

12. The photosensitive composition according to claim 5, wherein said pigment is dispersed to have an average diameter of from 0.01 to 0.7 µm.

13. The photosensitive composition according to claim 5, wherein said pigment is dispersed to have an average diameter of from 0.01 to 0.4 µm.

14. The photosensitive composition according to claim 5, further comprising a binder polymer that is substantially insoluble in water but soluble in alkali.

15. A method of producing a lithographic printing plate comprising:
  subjecting a lithographic printing plate precursor to scanning exposure using a light source emitting a laser beam having a wavelength shorter than 450 nm,
  wherein the printing plate precursor comprises a support having a hydrophilic surface and a photosensitive layer formed on the support,
  wherein the photosensitive layer comprises a photosensitive composition according to claim 1.

16. The method according to claim 15, wherein said light source is a semiconductor laser.

17. The method according to claim 16, wherein said scanning exposure is carried out with multi-beams.

18. The method according to claim 17, wherein said scanning exposure is carried out by an outer drum system.

19. The method for producing a lithographic printing plate according to claim 15, wherein the photosensitive composition further comprises a sensitizing dye having a greater absorbance at 400 nm than an absorbance at 500 nm.

20. The method of producing a lithographic printing plate according to claim 19, wherein said light source is a semiconductor laser.

* * * * *